(12) United States Patent
Sekiya et al.

(10) Patent No.: US 11,108,399 B2
(45) Date of Patent: Aug. 31, 2021

(54) WIRELESS COMMUNICATION APPARATUS

(71) Applicant: KABUSHIKI KAISHA TOSHIBA, Tokyo (JP)

(72) Inventors: Masahiro Sekiya, Inagi Tokyo (JP); Toshihisa Nabetani, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/014,616

(22) Filed: Sep. 8, 2020

(65) Prior Publication Data

US 2021/0111728 A1 Apr. 15, 2021

(30) Foreign Application Priority Data

Oct. 11, 2019 (JP) .............................. JP2019-187827

(51) Int. Cl.
*H03L 7/099* (2006.01)
*H03D 7/16* (2006.01)
*H04B 1/28* (2006.01)
*H04B 1/403* (2015.01)
*H04B 1/30* (2006.01)

(52) U.S. Cl.
CPC ............. *H03L 7/099* (2013.01); *H03D 7/165* (2013.01); *H04B 1/28* (2013.01); *H04B 1/30* (2013.01); *H04B 1/406* (2013.01)

(58) Field of Classification Search
CPC .......... H03L 7/099; H03D 7/165; H04B 1/28; H04B 1/30; H04B 1/406
See application file for complete search history.

(56) References Cited

U.S. PATENT DOCUMENTS

| 6,035,003 A | 3/2000 | Park et al. |
| 2009/0311979 A1* | 12/2009 | Husted ................ H03C 5/00 455/102 |
| 2012/0207080 A1* | 8/2012 | Chang ................. H04W 56/00 370/315 |
| 2016/0088602 A1 | 3/2016 | Seok |

(Continued)

FOREIGN PATENT DOCUMENTS

| JP | 3965638 B2 | 6/2007 |
| JP | 2017046109 A | 3/2017 |

(Continued)

OTHER PUBLICATIONS

"Part 11: Wireless LAN Medium Access Control (MAC) and Physical Layer (PHY) Specifications", IEEE Standard for Information technology—Telecommunications and information exchange between systems—Local and metropolitan area networks—Specific requirements, IEEE Std 802.11TM-2016, 2016, pp. 1-3532.

(Continued)

*Primary Examiner* — Nguyen T Vo
(74) *Attorney, Agent, or Firm* — Holtz, Holtz & Volek PC

(57) ABSTRACT

According to one embodiment, a wireless communication apparatus includes receiver circuitry and transmitter circuitry. The receiver circuitry is configured to receive a first frame addressed to another apparatus, the first frame being transmitted by a first wireless communication apparatus, and estimate a difference between an oscillation frequency of an oscillator of the first wireless communication apparatus and an oscillation frequency of an oscillator of the wireless communication apparatus based on the first frame. The transmitter circuitry is configured to transmit a third frame at a frequency determined based on the difference during a period at least partially overlapping a period during which the first wireless communication apparatus transmits a second frame addressed to a second wireless communication apparatus.

14 Claims, 13 Drawing Sheets

(56) References Cited

U.S. PATENT DOCUMENTS

| | | | |
|---|---|---|---|
| 2017/0063584 A1 | 3/2017 | Taniguchi | |
| 2017/0078107 A1* | 3/2017 | Itagaki | H04B 7/0697 |
| 2017/0279864 A1* | 9/2017 | Chun | H04L 65/80 |
| 2018/0014216 A1 | 1/2018 | Banerjea et al. | |
| 2020/0045560 A1 | 2/2020 | Vermani et al. | |
| 2020/0077441 A1 | 3/2020 | Madhavan et al. | |
| 2020/0119863 A1 | 4/2020 | Nakanishi et al. | |
| 2021/0067278 A1 | 3/2021 | Nabetani et al. | |

FOREIGN PATENT DOCUMENTS

| | | |
|---|---|---|
| JP | 2017092538 A | 5/2017 |
| JP | 6308562 B2 | 3/2018 |
| JP | 6399506 B2 | 9/2018 |
| JP | 2018148327 A | 9/2018 |
| JP | 2020036206 A | 3/2020 |
| JP | 2021040172 A | 3/2021 |

OTHER PUBLICATIONS

U.S. Appl. No. 16/804,780, filed Feb. 28, 2020, First Named Inventor: Toshihisa Nabetani, Title: "Wireless Communication Apparatus".

U.S. Appl. No. 16/804,780; First Named Inventor: Toshihisa Nabetani; Title: "Wireless Communication Apparatus", filed Feb. 28, 2020.

U.S. Appl. No. 17/008,749; First Named Inventor: Tatsuma Hirano; Title: "Electronic Apparatus and Method", filed Sep. 1, 2020.

U.S. Appl. No. 17/016,919; First Named Inventor: Masahiro Sekiya; Title: "Wireless Communication Apparatus, Method, and Wireless Communication System", filed Sep. 10, 2020.

* cited by examiner

| Identification number | MAC address | CFO value | Holding time |
|---|---|---|---|
| AP1-1 | AA:BB:CC:00:00:01 | 100 | X |
| AP1-2 | AA:BB:CC:00:00:02 | 50 | Y |
| AP1-3 | AA:BB:CC:00:00:03 | -100 | Z |

FIG. 9

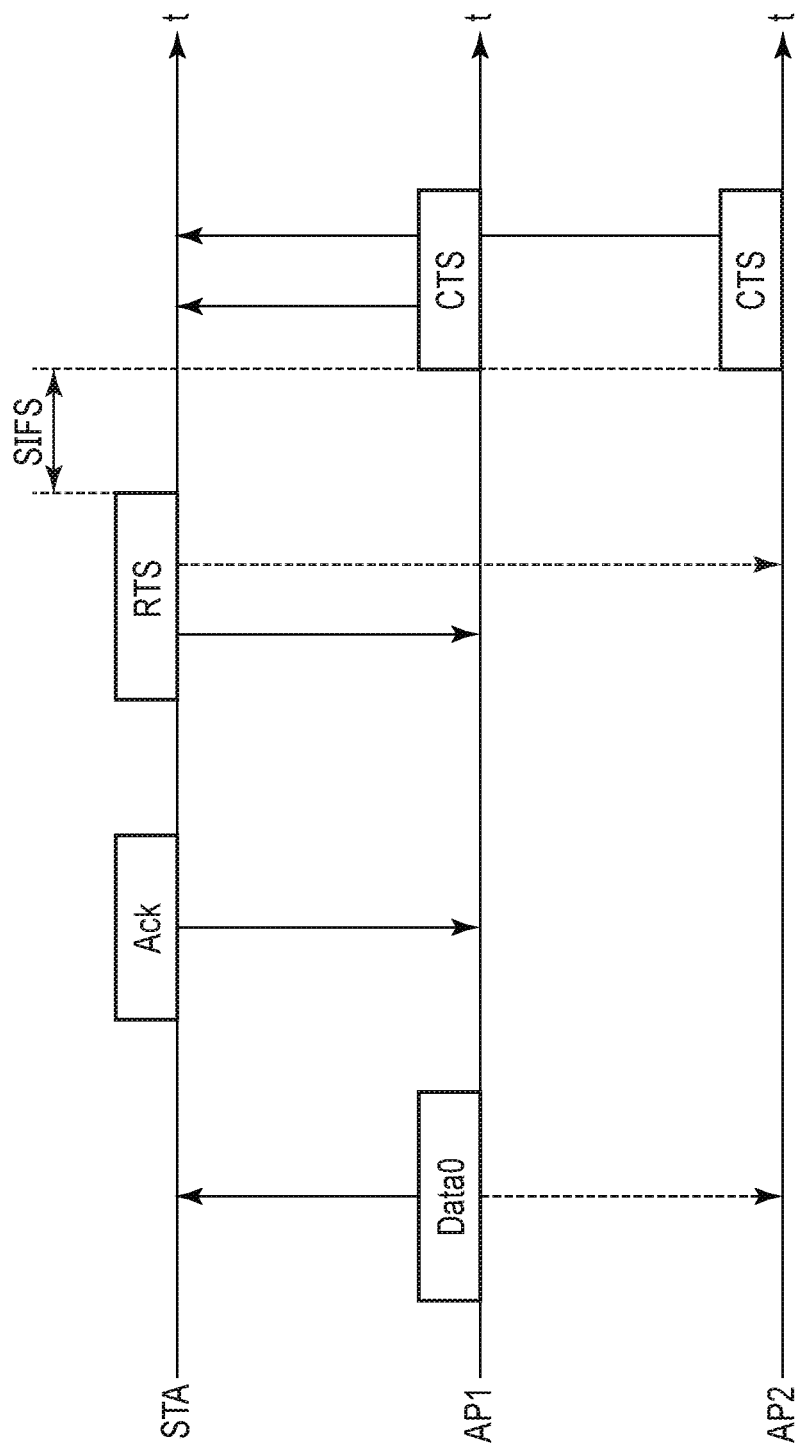
F I G. 11

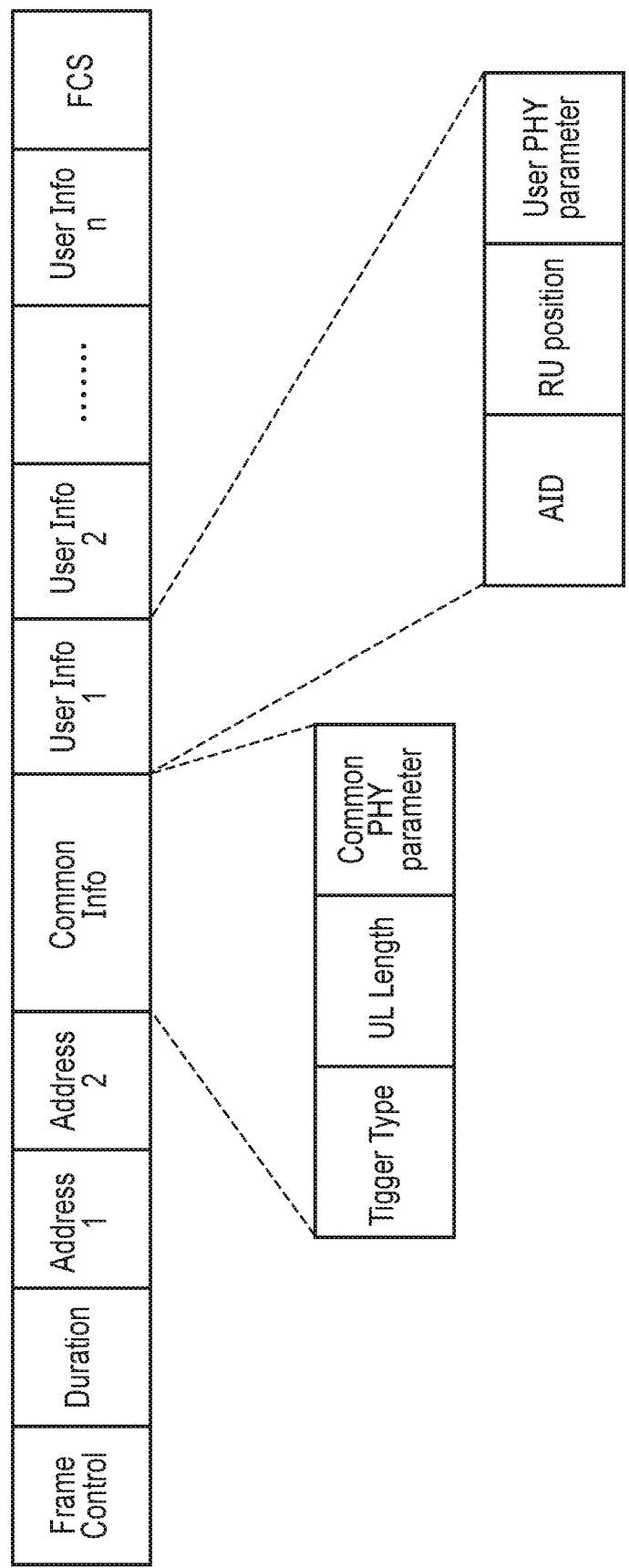
F I G. 13

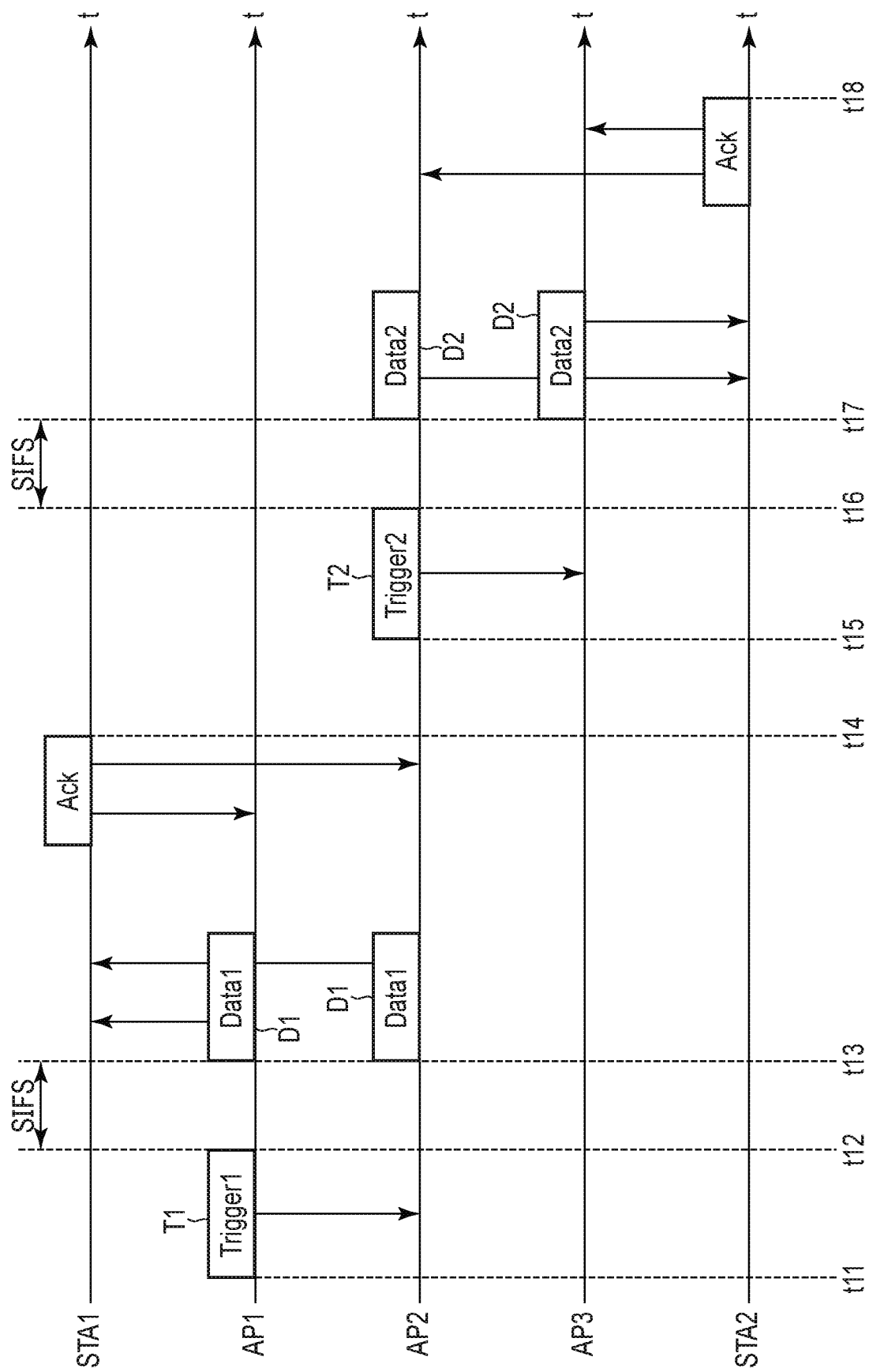
F I G. 14

WIRELESS COMMUNICATION APPARATUS

CROSS-REFERENCE TO RELATED APPLICATIONS

This application is based upon and claims the benefit of priority from Japanese Patent Application No. 2019-187827, filed Oct. 11, 2019, the entire contents of which are incorporated herein by reference.

FIELD

Embodiments described herein relate generally to a wireless communication apparatus.

BACKGROUND

In recent years, various techniques have been proposed for improving the reliability of communication. One of them is a technique that allows a wireless terminal to simultaneously transmit data to a plurality of wireless base stations. Due to this, since the wireless terminal can refer to a response from the wireless base stations, the reliability of communication can be improved. Therefore, there is a need for further advance of the above-described technique and further improvement in the reliability of communication.

BRIEF DESCRIPTION OF THE DRAWINGS

FIG. 9 is a diagram illustrating an example of a CFO value holding format in a first modification.

FIG. 11 is a diagram illustrating an overview of an operation of a wireless communication system in a second modification.

FIG. 13 is a diagram illustrating an example of a format of a trigger frame used in the second embodiment.

FIG. 14 is a diagram illustrating an overview of an operation of a wireless communication system in the second embodiment.

DETAILED DESCRIPTION

Figure 1:
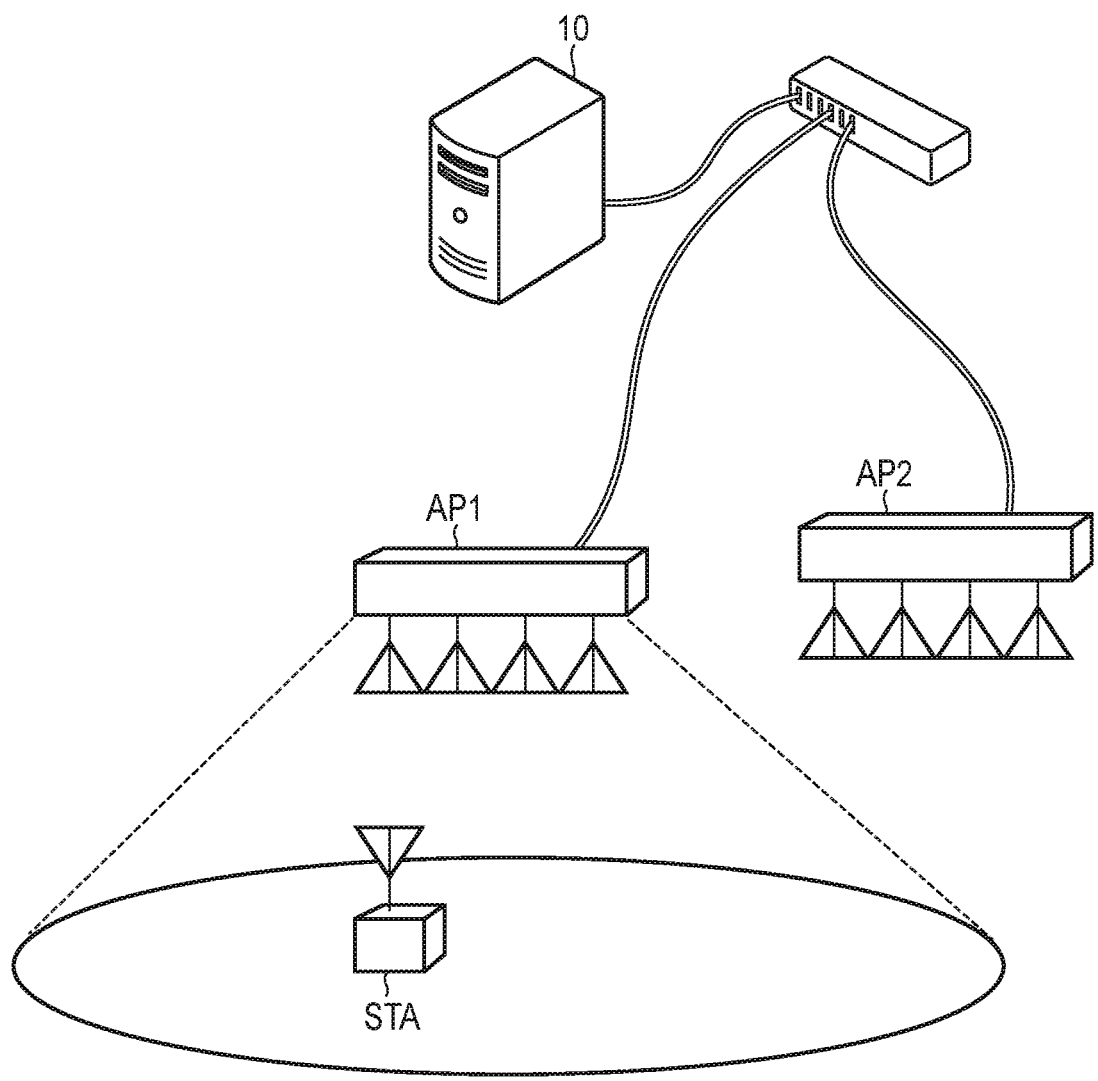
FIG. 1 is a diagram illustrating a schematic configuration example of a wireless communication system according to a first embodiment.

In general, according to one embodiment, a wireless communication apparatus comprises receiver circuitry and transmitter circuitry. The receiver circuitry is configured to receive a first frame addressed to another apparatus, the first frame being transmitted by a first wireless communication apparatus, and estimate a difference between an oscillation frequency of an oscillator of the first wireless communication apparatus and an oscillation frequency of an oscillator of the wireless communication apparatus based on the first frame. The transmitter circuitry is configured to transmit a third frame at a frequency determined based on the difference during a period at least partially overlapping a period during which the first wireless communication apparatus transmits a second frame addressed to a second wireless communication apparatus.

Embodiments will be described below with reference to the drawings. The disclosure of the embodiments is nothing but one example/and the invention is not limited by the descriptions of the embodiments. Modifications that could easily be conceived by a person with ordinary skill in the art are included in the scope of the disclosure. To clarify the descriptions, the drawings may show, for example, the size and shape of each component more schematically than those in the actual aspect. Elements corresponding to each other in the drawings are denoted by the same reference numeral and their detailed descriptions may be omitted.

First Embodiment

FIG. 1 illustrates a schematic configuration example of a wireless communication system according to an embodiment. In the wireless communication system illustrated in FIG. 1, one existing wireless base station AP (access point) 1, a wireless LAN system including one wireless terminal STA (station) belonging to a network formed by the wireless base station AP1, and at least one wireless base station AP2 added (newly installed) for the purpose of cooperating with the existing wireless base station AP1 are arranged. In the present embodiment, the wireless base station AP2 will be mainly described. Note that the wireless base stations AP1 and AP2 may be connected to a control apparatus 10 via Ethernet, (registered trademark). The control apparatus 10 performs setting of various parameters necessary for performing highly reliable wireless communication with the wireless base station AP2, selection of a variety of information transmitted from the wireless base stations AP1 and AP2 (for example, discarding of one of the frames when the same frames are transmitted from the wireless base stations AP1 and AP2, etc.), and the like.

Note that the present embodiment assumes that the wireless LAN system is an infrastructure mode network system (BSS: Basic Service Set) configured by one wireless base station AP and one or more wireless terminals STA, but is not limited thereto. The wireless LAN system may be configured by an ad hoc mode network system in which a plurality of wireless terminals STA perform direct communication with each other without passing through the wireless base station AP and one of the wireless terminals STA may operate as an owner in the ad hoc network. Further, the wireless base station AP that constitutes the wireless LAN system does not necessarily have to be fixed at a certain point. For example, the wireless terminal STA that can function as a simple wireless base station AP by changing an operation mode setting may be the wireless base station AP.

As described above, the wireless base station AP and the wireless terminal STA, which are included in the wireless communication system according to the present embodiment, can function as the wireless base station in a certain case and can function as the wireless terminal in another case. Therefore, hereinafter, the wireless base station AP and the wireless terminal STA are collectively referred to as a "wireless communication apparatus", and whether the wireless communication apparatus functions as the wireless base station AP or functions as the wireless terminal STA is identified by a code added to the end thereof.

Figure 2:
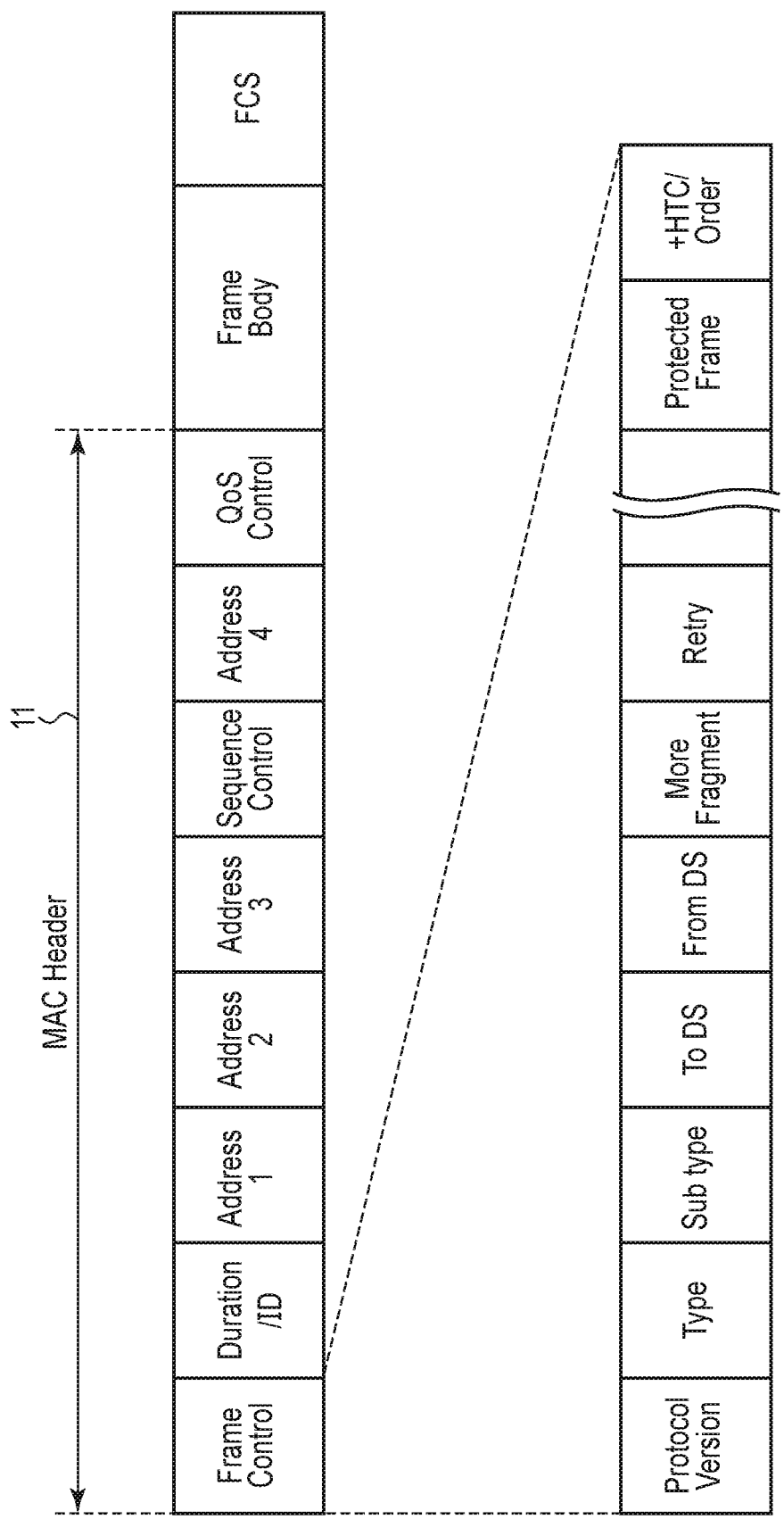
FIG. 2 is a diagram illustrating an example of a format of a MAC frame used in the first embodiment.

FIG. 2 illustrates an example of a format of a media access control (MAC) frame used in the present embodiment. Note that the present embodiment assumes that a frame in a wireless LAN system of the IEEE 802.11 standard is used. The IEEE 802.11 standard includes IEEE 802.11 standards that will be specified in the future, in addition to IEEE 802.11a, IEEE 802.11b, IEEE 802.11g, IEEE 802.11n, IEEE 802.11ac, IEEE 802.11ax, etc. However, the frame used in the wireless communication system according to the present embodiment is not limited to the frame in the wireless LAN system of the IEEE 802.11 standard described above, and a frame in any wireless communication system may be used.

As illustrated in FIG. 2, the MAC frame includes a MAC Header, a Frame Body, and a Frame Check Sequence (FCS).

In the MAC Header, information necessary for a reception process in the MAC layer is set. In the Frame Body, information (data from the upper layer, etc.) according to the type of the frame is set. In the FCS, an error detection code (CRC: Cyclic Redundancy Code) calculated for determining whether the MAC Header and the Frame Body can be normally received is set.

As illustrated in FIG. 2, the MAC Header includes a Frame Control field, a Duration/ID field, an Address 1 field, an Address 2 field, an Address 3 field, a Sequence Control field, an Address 4 field, a Quality of Service (QoS) Control field, and the like. Note that the various fields included in the MAC Header are not limited to the above-described fields. For example, new fields may be further added, or some fields may be deleted.

In the Frame Control field, a value according to the type of the frame is set.

The Duration/ID field indicates a period (NAV: Network Allocation Vector) for waiting the transmission of a wireless signal by another wireless communication apparatus, or an identification number assigned to the wireless communication apparatus STA connected to the wireless communication apparatus AP. The Duration/ID field has a length of 16 bits. When the most significant bit (MSB) is 0, the lower 15 bits indicate the above-described NAV, and when the most significant bit is 1, a part of the lower 15 bits indicate the above-described identification number.

In the Address 1 field, a MAC address of a direct receiving station is set and used to, for example, determine whether the frame is addressed to the own apparatus.

In the Address 2 field, a MAC address of a direct transmitting station is set.

In the Address 3 field, a MAC address of an apparatus which is a final destination in an uplink is set, and a MAC address of an apparatus that is a transmission source in a downlink is set.

The Address 4 field is set only when the wireless communication apparatus AP transmits a frame to another wireless communication apparatus AP, and the MAC address of the apparatus that is the transmission source is set.

A sequence number of data to be transmitted, a fragment number when data is fragmented, and the like are set in the Sequence Control field.

Details of the QoS Control field will be described below.

Here, the Frame Control field will be described in more detail.

As illustrated in FIG. 2, the Frame Control field includes a Protocol Version field, a Type field, a Subtype field, a To DS field, a From DS field, a More Fragment field, a Retry field, a Protected Frame field, a +HTC/Order field, and the like. Note that the various fields included in the Frame Control field are not limited to the above-described fields. For example, new fields may be further added, or some fields may be deleted.

In the Protocol Version field, information indicating a protocol version used is set.

A bit pattern for identifying the frame type is set in the Type field and indicates which of a control frame, a management frame, and a data frame the frame type belongs to.

In the Subtype field, a bit pattern for identifying the type of the MAC frame in the frame type identified by the Type field is set. For example, the bit pattern indicates whether the type of the MAC frame is a QoS data frame or a non-QoS data frame.

Information related to the receiving station is set in the To DS field and indicates whether the receiving station is the wireless communication apparatus AP or the wireless communication apparatus STA. Specifically, when a bit is 1, it indicates that the receiving station is the wireless communication apparatus AP, and when a bit is 0, it indicates that the receiving station is the wireless communication apparatus STA.

Information related to the transmitting station is set in the From DS field and indicates whether the transmitting station is the wireless communication apparatus AP or the wireless communication apparatus STA. Specifically/when a bit is 1, it indicates that the transmitting station is the wireless communication apparatus AP, and when a bit is 0, it indicates that the transmitting station is the wireless communication apparatus STA.

The More Fragment field is set when data is fragmented, and information indicating whether a subsequent fragment frame is present is set. Specifically, when a bit is 1, it indicates that the subsequent fragment frame is present, and when a bit is 0, it indicates that the subsequent fragment frame is not present.

The Retry field is set when the frame is a frame to be retransmitted (retransmission frame), and information indicating whether the frame is the retransmission frame is set. Specifically, when a bit is 1, it indicates that the frame is the retransmission frame, and when a bit is 0, it indicates that the frame is not the retransmission frame.

Information indicating whether the frame is protected (encrypted) is set in the Protected Frame field. Specifically, when a bit is 1, it indicates that the frame is encrypted, and when a bit is 0, it indicates that the frame is not encrypted.

The +HTC/Order field indicates that, when the non-QoS data frame is transmitted, the frame order should not be changed at the time of relaying the frame, and means that, when the QoS data frame is transmitted in an IEEE 802.11n/ac/ax physical frame, an HT Control field (not illustrated) is included in the MAC Header. The HT Control field is included between the QoS Control field and the Frame Body and is used to notify a part of the functions specified by the IEEE 802.11n/ac/ax.

The QoS Control field is added to the QoS data frame that is one of the data frames. On the other hand, the QoS Control field is not added to the non-QoS data frame. That is, the QoS Control field is added when the frame type identified by the Type field is the data frame and the type of the MAC frame identified by the Subtype field is the QoS data frame.

The QoS Control field includes a Traffic ID (TID) field in which an identifier corresponding to a data traffic is set, an Ack policy field in which a delivery confirmation method is set, and the like.

The TID field is used to determine the traffic type of data. The Ack policy field is used to determine whether the QoS data is transmitted according to Normal Ack policy, Block Ack policy, or No Ack policy. For example, in the case of the Normal Ack policy, the Ack policy field indicates that the receiving station having received the QoS data needs to immediately return a response frame.

Figure 3:
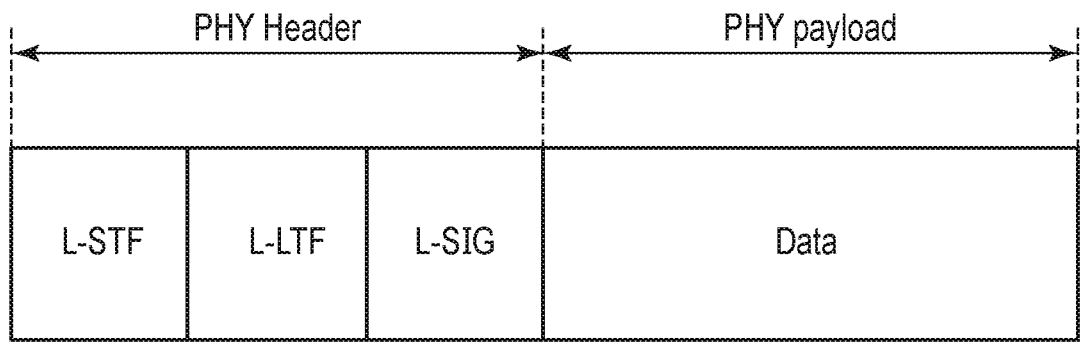
FIG. 3 is a diagram illustrating an example of a format of a PHY frame used in the first embodiment.

FIG. 3 illustrates an example of the format of the PHY (Physical) frame used in the present embodiment. As illustrated in FIG. 3, the PHY frame includes a PHY Header and a PHY payload, and the PHY Header includes a Legacy Preamble. The PHY payload includes information indicating a MAC frame on which an Orthogonal Frequency Divisional Multiplexing (OFDM) modulation process has been performed.

The Legacy Preamble has a configuration specified in the IEEE 802.11a or the IEEE 802.11a and includes a non-HT Short Training field (L-STF), a non-HT Long Training field (L-LTF), a non-HT Signal field (L-SIG), and the like.

The L-STF and the L-LTF indicate known bit patterns. For example, the receiving station that receives the frame refers to the bit pattern and performs received power adjustment or timing synchronization, channel estimation, carrier frequency offset estimation, and the like.

Information indicating a transmission rate of a PHY payload, information indicating a byte length of a MAC frame, or the like is set in the L-SIG.

Note that the frame format of the PHY frame specified in the IEEE 802.11a is illustrated in FIG. 3, but other frame formats of the PHY frame specified in the IEEE 802.11 standard may be used in the wireless communication system according to the present embodiment.

Figure 4:
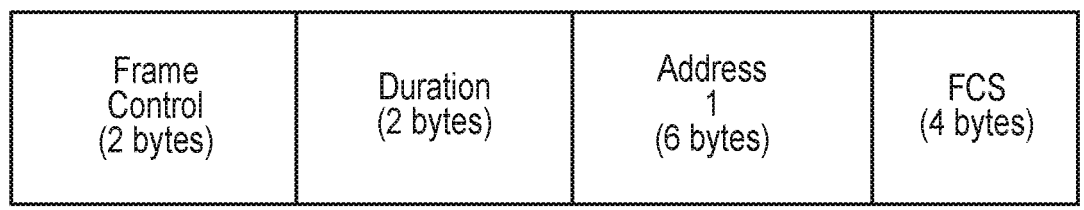
FIG. 4 is a diagram illustrating an example of a format of an Ack frame used in the first embodiment.

FIG. 4 illustrates an example of the format of the Ack frame used in the present embodiment. The Ack frame is a type of a response frame. As illustrated in FIG. 4, the Ack frame includes a Frame Control field, a Duration field, an Address 1 field, an FCS, and the like.

The Frame Control field, the Duration field, and the Address 1 field play the same role as in the case of the MAC frame illustrated in FIG. 2.

For example, a bit pattern capable of identifying the Ack frame is set in a Type field and a Subtype field (not illustrated) included in the Frame Control field. Specifically, a 2-bit bit pattern "01" is set in the Type field, and a 4-bit bit pattern "1101" is set in the Subtype field.

Information indicating the destination of the Ack frame is set in the Address 1 field.

When a plurality of wireless communication apparatuses return an Ack frame to a certain MAC frame, the same value is set in the Frame Control field, the Duration field, and the Address 1 field. Therefore, the CRC set in the FCS is also the same, and the wireless communication apparatuses return the same Ack frame.

A byte length of each field included in the Ack frame is specified by the IEEE 802.11 standard. The Frame Control field is 2 bytes, the Duration field is 2 bytes, the Address 1 field is 6 bytes, the FCS is 4 bytes, and the total byte length of the Ack frame is 14 bytes.

Figure 5:
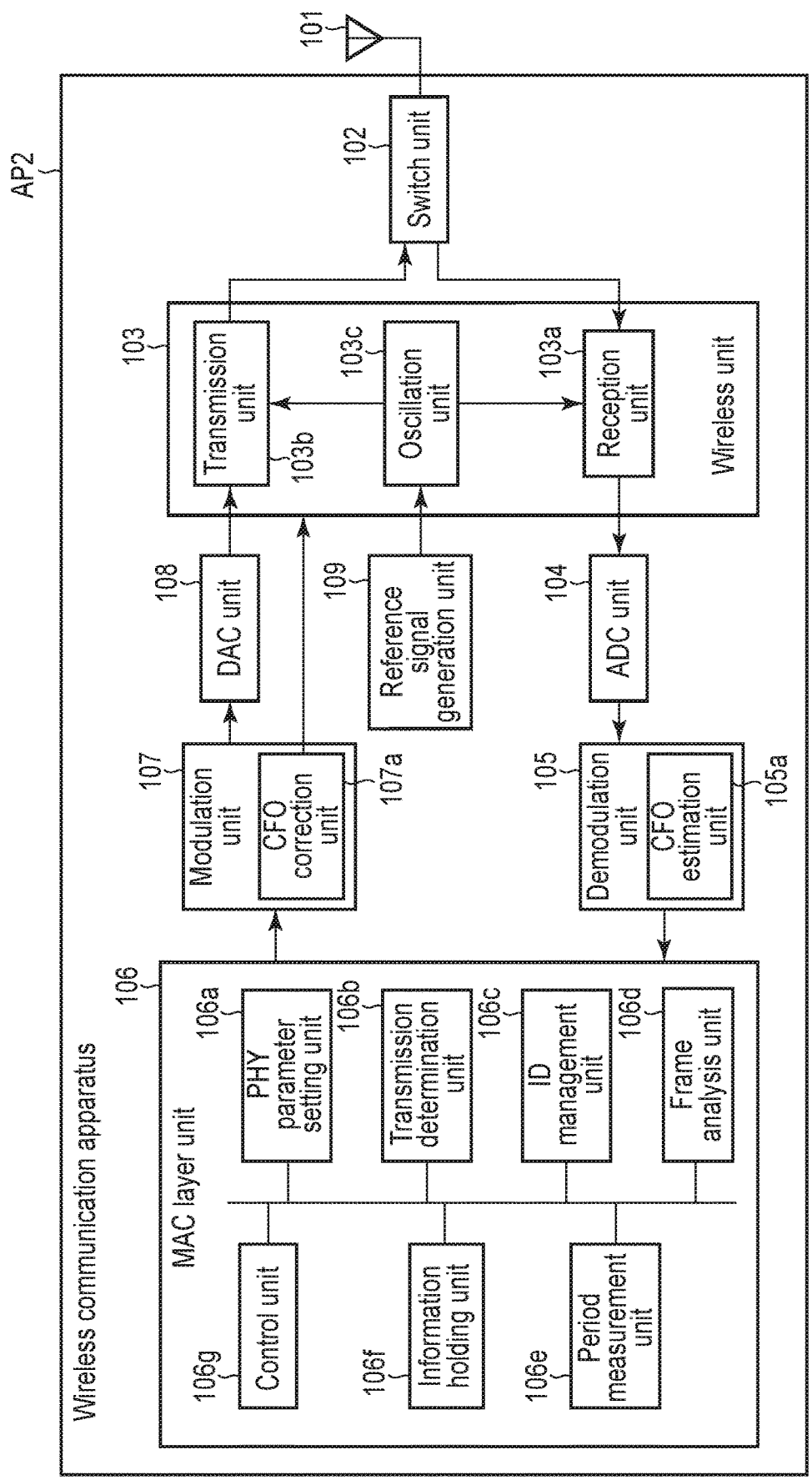
FIG. 5 is a diagram illustrating a configuration example of a wireless communication apparatus in the first embodiment.

FIG. 5 illustrates a configuration example of the wireless communication apparatus AP2 illustrated in FIG. 1. The wireless communication apparatus AP2 is a wireless communication apparatus added for the purpose of cooperating with another wireless communication apparatus (for example, the wireless communication apparatus AP1 illustrated in FIG. 1). The wireless communication apparatus AP2 complies with, for example, the IEEE 802.11 standard.

As illustrated in FIG. 5, the wireless communication apparatus AP2 includes an antenna 101, a switch unit 102, a wireless unit 103, an Analog to Digital Converter (ADC) unit 104, a demodulation unit 105, a MAC layer unit 106, a modulation unit 107, a Digital to Analog Converter (DAC) unit 108, a reference signal generation unit 109, and the like.

The antenna 101 receives an analog wireless signal transmitted in, for example, a 2.4 GHz band or a 5 GHz band. The received analog wireless signal is input to the wireless unit 103 via the switch unit 102.

The switch unit 102 is connected to the wireless unit 103. The wireless unit 103 includes a reception unit 103a, a transmission unit 103b, and an oscillation unit 103c, and the switch unit 102 is switchably connected to one of the reception unit 103a and the transmission unit 103b of the wireless unit 103. The switch unit 102 is connected to the reception unit 103a in cases other than the case in which the wireless communication apparatus AP2 transmits the wireless signal. On the other hand, the switch unit 102 is connected to the transmission unit 103b when the wireless communication apparatus AP2 transmits the wireless signal. Whether the switch unit 102 is connected to the reception unit 103a or whether the switch unit 102 is connected to the transmission unit 103b may be performed by the switch unit 102 itself or may be controlled by another circuit. For example, the modulation unit 107 may recognize a period in which the wireless signal is transmitted by the wireless communication apparatus AP2, may control the switch unit 102 so that the antenna 101 and the transmission unit 103b are connected to each other during the period, and may control the switch unit 102 so that the antenna 101 and the reception unit 103a are connected to each other after the period ends.

In the following, first, each unit that operates during a reception process of receiving a wireless signal will be described.

When the analog wireless signal received by the antenna 101 is input to the reception unit 103a via the switch unit 102, the reception unit 103a frequency-converts (down-converts) the analog wireless signal into a signal of an appropriate frequency band (for example, a baseband signal) by using a signal having the same frequency as a carrier signal generated by the oscillation unit 103c, and outputs the frequency-converted (down-converted) analog wireless signal to the ADC unit 104.

The ADC unit 104 converts the frequency-converted analog signal into a digital signal and outputs the digital signal, to the demodulation unit 105. The demodulation unit 105 performs a reception process including a demodulation process and a decoding process complying with a certain standard with respect to the digital signal output from the ADC unit 104, and converts the digital signal into a MAC frame specified in the certain standard. Here, since it is assumed that the wireless communication apparatus AP2 complies with the IEEE 802.11 standard (including IEEE 802.11 standards that will be specified in the future, in addition to IEEE 802.11a, IEEE 802.11b, IEEE 802.11g, IEEE 802.11n, IEEE 802.11ac, IEEE 802.11ax, IEEE 802.11be, etc.), the demodulation unit 105 performs a reception process complying with the IEEE 802.11 standard with respect to the input digital signal and converts the digital signal into the MAC frame specified in the IEEE 802.11 standard. This MAC frame is transmitted to the MAC layer unit 106.

Note that, in the demodulation unit 105, an OFDM symbol timing synchronization process, a fast Fourier, transform (FFT) process, a deinterleave process, an error correction decoding process, and the like are performed as a reception process for the input digital signal. Further, the demodulation unit 105 also extracts various types of information included in the PHY Header illustrated in FIG. 3. The demodulation unit 105 uses the extracted various types of information for a demodulation process and transfers the information to the MAC layer unit 106.

Next, each unit that operates during a transmission process of transmitting a wireless signal will be described. Note that the MAC layer unit 106 generates a MAC frame and the like, but details of the MAC layer unit 106 will be described below, and thus detailed description thereof will be omitted herein.

The modulation unit 107 performs a transmission process including a modulation process and a coding process complying with a certain standard with respect to the MAC frame transferred from the MAC layer unit 106, and converts the MAC frame into a digital signal. Here, since it is assumed that the wireless communication apparatus AP2 complies with the IEEE 802.11 standard (including IEEE 802.11 standards that will be specified in the future, in addition to IEEE 802.11a, IEEE 802.11b, IEEE 802.11g, IEEE 802.11n, IEEE 802.11ac, IEEE 802.11ax, IEEE 802.11be, etc.), the modulation unit 107 performs a transmission process complying with the IEEE 802.11 standard with respect to the input MAC frame and converts the MAC frame into the digital signal. This digital signal is output to the DAC unit 108. The DAC unit 108 converts the digital signal output from the modulation unit 107 into the analog signal (baseband signal) and outputs the analog signal to the transmission unit 103b.

The transmission unit 103b frequency-converts (up-converts) the baseband signal output from the DAC unit 108 into a certain frequency band (for example, a frequency in a 2.4 GHz band or a 5 GHz band) by using a carrier signal generated by the oscillation unit 103c, and transmits the frequency-converted (up-converted) signal as a wireless signal from the antenna 101 via the switch unit 102.

Here, the oscillation unit 103c that operates during the reception process and the transmission process of the wireless signal will be described.

The oscillation unit 103c generates the carrier signal of the constant frequency synchronized with the phase of the input signal and is configured by, for example, a phase locked loop (PLL). The input signal to the oscillation unit 103c is generated by a reference signal generation unit 109. The reference signal generation unit 109 is configured by, for example, a crystal oscillator or a quartz oscillator. The oscillation unit 103c generates the carrier signal of the constant frequency synchronized with the phase of the oscillation signal by dividing, multiplying, or dividing and multiplying the input signal (which may be referred to as the oscillation signal or the reference signal) from the reference signal generation unit 109. The PLL that constitutes the oscillation unit 103c includes a voltage controlled oscillator (VCO) and performs feedback control using the VCO based on the oscillation signal from the reference signal generation unit 109 to generate the carrier signal of the constant frequency. Therefore, the oscillation unit 103c generates the carrier signal of a high frequency (for example, 2.4 GHz or 5 GHz) used for wireless communication from the oscillation signal of a low frequency (for example, 40 MHz).

Next, the MAC layer unit 106 will be described.

As illustrated in FIG. 5, the MAC layer unit 106 includes a PHY parameter setting unit 106a, a transmission determination unit 106b, an ID management unit 106c, a frame analysis unit 106d, a period measurement unit 106e, an information holding unit 106f, and a control unit 106g.

When the response frame is transmitted to the MAC frame transmitted from the demodulation unit 105, the PHY parameter setting unit 106a generates a transmission rate, a byte length of a transmission frame, a scrambler initial value, and the like, which are required in the modulation unit 107.

The transmission determination unit 106b determines whether to return the response frame to the MAC frame transmitted from the demodulation unit 105.

The ID management unit 106c manages the MAC address of the wireless communication apparatus to be cooperated.

The frame analysis unit 106d analyzes the MAC frame transmitted from the demodulation unit 105, determines whether the MAC frame is a frame requesting a response frame, extracts the MAC address (reception address) set in the Address 1 field of the MAC frame, extracts the MAC address (transmission address) set in the Address 2 field of the MAC frame, and checks the CRC of the MAC frame (that is, determines whether the reception is successful).

The period measurement unit 106e measures a period called Short Inter-frame Spacing (SIFS) when the response frame is returned to the MAC frame transmitted from the demodulation unit 105. Note that, in the present embodiment, it is assumed that the SIFS described above is, for example, 16 μsec, but it is not limited thereto, and the SIFS described above may be any value as long as the SIFS is a value that allows the response frame to be returned with priority over the transmission of other frames.

The information holding unit 106f holds a frequency offset value and the like required when the response frame is transmitted to the MAC frame transmitted from the demodulation unit 105.

The control unit 106g controls the operation of each of the above-described units 106a to 106f.

Here, a carrier frequency offset (CFO) will be described before describing a CFO estimation unit 105a included in the demodulation unit 105 and a CFO correction unit 107a included in the modulation unit 107 illustrated in FIG. 5.

In the wireless LAN system, the wireless communication apparatus that transmits the wireless signal up-converts the baseband signal by using the carrier signal of a certain frequency (oscillation frequency) and transmits the up-converted baseband signal as the wireless signal. The above-described carrier signal is generated by the oscillation unit (for example, PLL) mounted on the wireless communication apparatus on the transmitting side. On the other hand, the wireless communication apparatus that receives the wireless signal, performs a demodulation process after down-converting the received wireless signal into the baseband signal by using the signal generated at the same frequency as the carrier signal of the above-described certain frequency. The above-described signal is generated by the oscillation unit (for example, PLL) mounted on the wireless communication apparatus on the receiving side.

Here, in general, an oscillation frequency of an oscillation unit of a certain wireless communication apparatus (for example, a wireless communication apparatus on a transmitting side) and an oscillation frequency of an oscillation unit of a wireless communication apparatus (for example, a wireless communication apparatus on a receiving side) different from the certain wireless communication apparatus have a frequency shift (for example, an error of about 20 ppm for the wireless LAN) due to individual differences in the reference signal generation unit (for example, crystal oscillator). The error (frequency shift) in the oscillation frequency between these wireless communication apparatuses is called a carrier frequency offset. When there is the carrier frequency offset, the transmission characteristics of the wireless signal deteriorates. Thus, no carrier frequency offset is preferable.

Therefore, in order to reduce the carrier frequency offset, it is known that, what kind of control is to be performed between the wireless communication apparatuses (for example, between the wireless communication apparatus on the receiving side and the wireless communication apparatus on the transmitting side) is predetermined, and a process of reducing the carrier frequency offset according to the predetermined control method is performed when the wireless signal is transmitted and received.

However, the present embodiment assumes a case in which the wireless communication apparatus AP2 is added (newly installed) to the wireless LAN system configured by the existing wireless communication apparatus AP1 and the existing wireless communication apparatus STA for the purpose of cooperating with the existing wireless communication apparatus AP1. Although the new wireless communication apparatus AP2 can recognize the cooperation with the existing wireless communication apparatus AP1, but the existing wireless communication apparatus AP1 cannot recognize the cooperation with the new wireless communication apparatus AP2. Therefore, there is an inconvenience that it is impossible to determine in advance what kind of control is to be performed in order to reduce the carrier frequency offset between the wireless communication apparatuses AP1 and AP2. According to this inconvenience, when the response frames are simultaneously transmitted from the wireless communication apparatuses AP1 and AP2, the frequencies of the response frames are shifted and the wireless communication apparatus STA on the receiving side may not be able to normally receive the response frames.

The CFO estimation unit 105a and the CFO correction unit 107a illustrated in FIG. 5 are provided for eliminating the above-mentioned inconvenience.

The CFO estimation unit 105a refers to the L-STF and the L-LTF included in the PHY Header of the wireless signal received by the reception unit 103a and estimates the carrier frequency offset (CFO) between the oscillation unit mounted on the wireless communication apparatus that has transmitted the wireless signal and the oscillation unit 103c mounted on the own apparatus. The CFO estimation unit 105a calculates a CFO value based on the estimated CFO and transmits the calculated CFO value to the MAC layer unit 106. The CFO value is a value when the estimated CFO is represented by a certain resolution. For example, when the resolution is 70 Hz and the estimated CFO is 7 kHz, the CFO value is 100 (=7000/70).

The CFO correction unit 107a calculates a CFO correction value for correcting the oscillation frequency generated when the wireless communication apparatus AP2 transmits the wireless signal, based on the CFO value transmitted from the MAC layer unit 106. By applying the calculated CFO correction value to the oscillation unit 103c, the oscillation unit 103c is controlled so that the carrier frequency offset with respect to the wireless communication apparatus that has transmitted the wireless signal used to calculate the CFO correction value becomes zero or falls within a certain allowable error range (for example, within 2 kHz). Note that, here, the case in which the carrier frequency offset is reduced by applying the CFO correction value to the oscillation unit 103c is presented as an example, the present embodiment is not limited thereto. The CFO correction value may be applied to the reference signal generation unit 109, which may reduce the carrier frequency offset.

As another method of correcting the carrier frequency offset and transmitting the corrected carrier frequency offset, the following process may be employed. That is, when a baseband signal is processed at the time of transmission, such process may be carried out on the baseband signal that cancels the difference in carrier frequency offset according to the amount of the difference.

For example, when the baseband signal is x(t), the signal s(t) transmitted from the antenna can be represented by $$s(t)=\text{Re}[x(t)*\exp(j2\pi*fc*t)].$$

Note that fc is the carrier signal frequency and t is the time.

Here, when a carrier frequency offset difference is Δf, s(t) can be represented by $$s'(t)*\text{Re}[x(t)*\exp(j2\pi*(fc+\Delta f)*t)].$$

Therefore, at the stage of the baseband signal processing, s'(t) can be transmitted as s(t) by performing a process of x(t)*exp(-j*2*π*Δf*t) on x(t).

Each unit included in the wireless communication apparatus AP2 illustrated in FIG. 5 may be realized by causing a processor (not illustrated) to execute software, may be realized by hardware such as an analog circuit or a digital circuit, or may be realized by a combination of software and hardware. Note that, the reception unit 103a and the CFO estimation unit 105a are referred to receiver circuitry. Note that, the transmission unit 103b, the transmission determination unit 106b and the CFO correction unit 107a are referred to transmitter circuitry. Note that, the information holding unit 106f is referred to memory.

Figure 6:
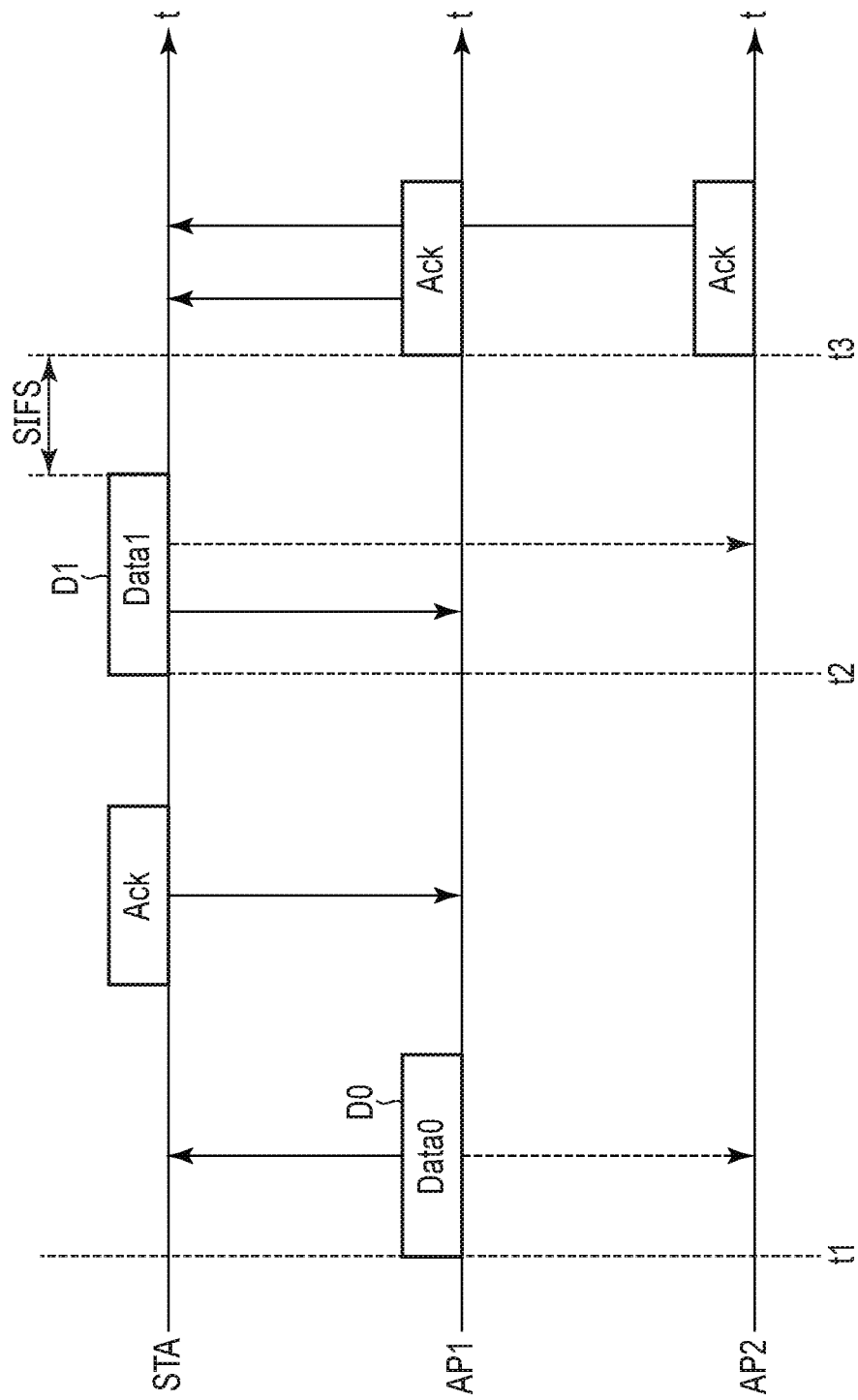
FIG. 6 is a diagram illustrating an overview of the operation of the wireless communication system in the first embodiment.

Here, the overview of the operation of the wireless communication system in the first embodiment will be described with reference to FIG. 6. In FIG. 6, an operation in which the wireless communication apparatus AP2 estimates the CFO based on the data frame destined for the other apparatus, which is transmitted by the wireless communication apparatus AP1 to be cooperated, and returns the response frame at the same timing as the wireless communication apparatus AP1 with respect to the data frame addressed to the wireless communication apparatus AP1 to be cooperated will be described. Note that, in FIG. 6, it is assumed that the response frame is the Ack frame.

First, at time t1, the existing wireless communication apparatus AP1 transmits a data frame D0 addressed to the wireless communication apparatus STA, and the wireless communication apparatus STA receives the data frame D0. The wireless communication apparatus STA refers to the Address 1 field of the received data frame D0, confirms whether data included in the data frame D0 can be received without error when it is recognized that the destination of the data frame D0 is the own apparatus, and returns the Ack frame addressed to the wireless communication apparatus AP1 when the reception is successful.

On the other hand, the wireless communication apparatus AP2 receives the data frame D0 addressed to another apparatus, which is transmitted by the wireless communication apparatus AP1 to be cooperated. The wireless communication apparatus AP2 uses the received data frame D0 to estimate the CFO between the oscillation unit mounted on the wireless communication apparatus AP1 to be cooperated and the oscillation unit 103c mounted on the own apparatus.

After that, the wireless communication apparatus AP2 calculates the CFO value based on the estimated CFO and holds the calculated CFO value, the MAC address of the wireless communication apparatus AP1 to be cooperated, and the current time (time t1) in association with each other.

Subsequently, at time t2, the wireless communication apparatus STA transmits a data frame D1 addressed to the wireless communication apparatus AP1, and the wireless communication apparatus AP1 receives the data frame D1. The wireless communication apparatus AP1 refers to the Address 1 field of the received data frame D1, confirms whether data included in the data frame D1 can be received without error when it is recognized that the destination of the data frame D1 is the own apparatus, and returns the Ack frame addressed to the wireless communication apparatus STA when the reception is successful. Note that the Ack frame is returned at time t3 after SIF'S has elapsed from the end of the received data frame D1.

On the other hand, the wireless communication apparatus AP2 receives the data frame D1 addressed to the wireless communication apparatus AP1 to be cooperated, confirms whether data included in the data frame D1 can be received without error, and confirms whether the destination of the data frame D1 is the wireless communication apparatus AP1 to be cooperated when the reception is successful. When it is confirmed that the destination of the received data frame D1 is the wireless communication apparatus AP1 to be cooperated, the wireless communication apparatus AP2 returns the Ack frame addressed to the wireless communication apparatus STA. When returning the Ack frame, the wireless communication apparatus AP2 obtains the CFO value held in association with the MAC address of the wireless communication apparatus AP1 that is the destination of the data frame D1, calculates the CFO correction value based on the obtained CFO value, and applies the calculated CFO correction value to the oscillation unit 103c. Therefore, the wireless communication apparatus AP2 can return the Ack frame after the carrier frequency offset with respect to the wireless communication apparatus AP1 becomes zero or falls within an allowable error range.

Note that the Ack frame is returned at time t3 after SIFS has elapsed from the end of the data frame D1, as in the wireless communication apparatus AP1. Therefore, the wireless communication apparatuses AP1 and AP2 can simultaneously return the Ack frames to the wireless communication apparatus STA.

The Ack frame returned by the wireless communication apparatus AP2 may be the same as the transmission time of the wireless communication apparatus AP1, and there may be a lag less than a guard interval period (for example, 0.8 μsec) of the Ack frame. The guard interval is a period added for the purpose of avoiding difficulty in demodulation due to overlapping of the wireless signal received by the wireless apparatus with a delay and the wireless signal received earlier. According to the wireless LAN standard, the guard interval is applied to the signal transmitted by OFDM modulation, and, for example, 0.8 μsec, 1.6 μsec, 3.2 μsec, or the like is used.

In FIG. 6, in order for the wireless communication apparatus AP2 to estimate the CFO with the wireless communication apparatus AP1 to be cooperated, the case of using the data frame D0 addressed to the wireless communication apparatus STA transmitted by the wireless communication apparatus AP1 is assumed, but the present embodiment is not limited thereto. The wireless communication apparatus AP2 may estimate the CFO by using the frame addressed to another wireless communication apparatus or the frame addressed to the own apparatus, and may estimate the CFO by using a group cast frame (for example, a beacon frame) transmitted by the wireless communication apparatus AP1.

Further, in FIG. 6, in order for the wireless communication apparatus AP2 to estimate the CFO with the wireless communication apparatus AP1 to be cooperated, the case of using one data frame D0 addressed to the wireless communication apparatus STA transmitted by the wireless communication apparatus AP1 is assumed, but the present embodiment is not limited thereto. The wireless communication apparatus AP2 receives the frame corresponding to the above-described data frame D0 transmitted by the wireless communication apparatus AP1 a plurality of times, estimates the CFO with the wireless communication apparatus AP1 whenever these frames are received, and calculates an average value of CFOs estimated a plurality of times to estimate an accurate CFO with the wireless communication apparatus AP1.

Figure 7:
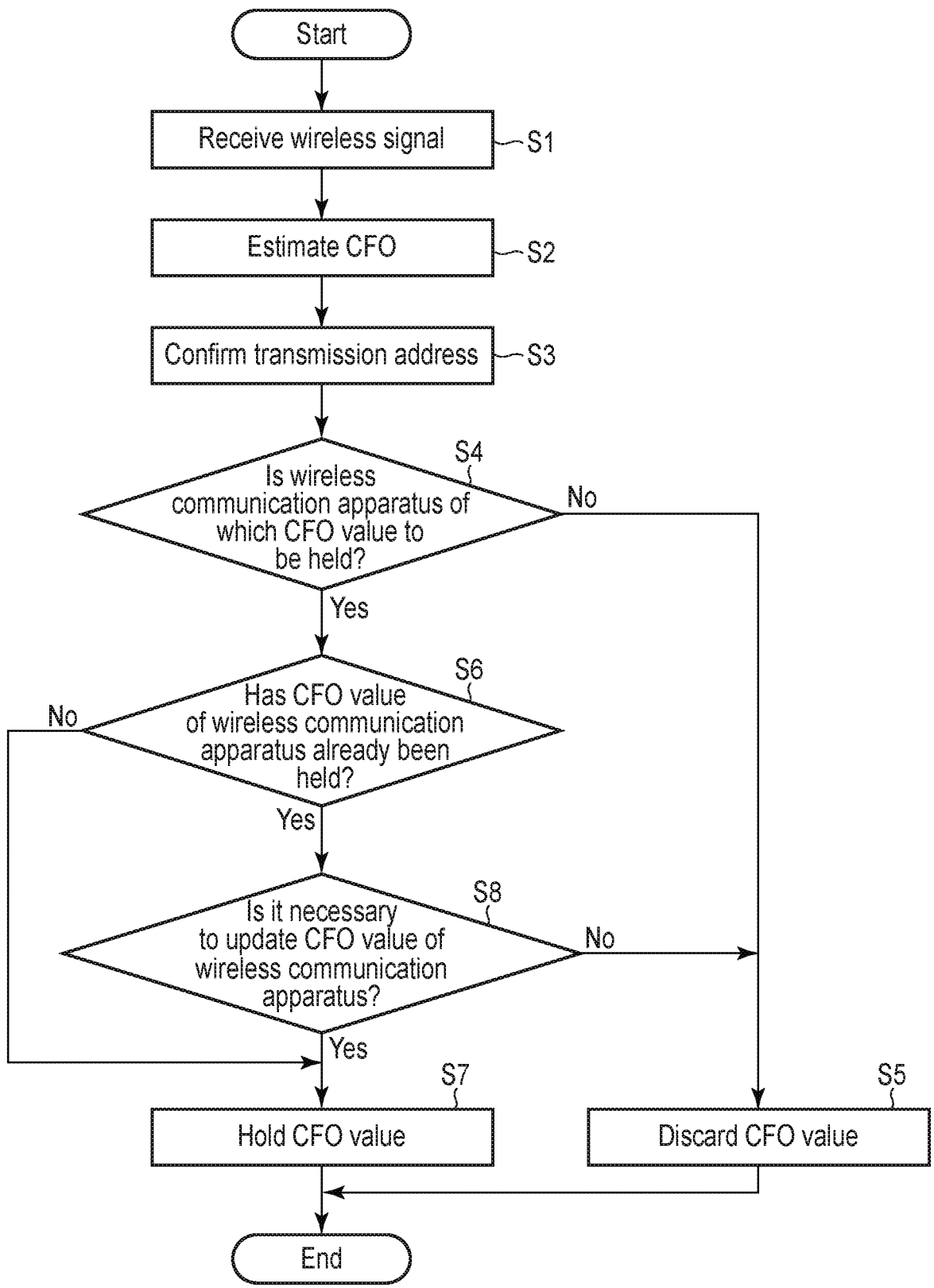
FIG. 7 is a flowchart illustrating an example of the operation of the wireless communication apparatus in the first embodiment.

FIG. 7 is a flowchart illustrating an example of a procedure of a process in which the wireless communication apparatus AP2 estimates the CFO with the wireless communication apparatus to be cooperated by using the data frame transmitted from the wireless communication apparatus to be cooperated.

First, the wireless communication apparatus AP2 receives the wireless signal (step S1). Subsequently, the CFO estimation unit 105a of the wireless communication apparatus AP2 refers to the PHY Header of the received wireless signal, estimates the CFO of the oscillation unit mounted on the wireless communication apparatus that has transmitted the wireless signal and the oscillation unit 103c mounted on the own apparatus, and calculates the CFO value based on the estimated CFO. The demodulation unit 105 transmits the demodulated MAC frame to the MAC layer unit 106 together with the CFO value calculated by the CFO estimation unit 105a (step S2).

The frame analysis unit 106d of the wireless communication apparatus AP2 analyzes the MAC Header of the MAC frame transmitted from the demodulation unit 105 and confirms the MAC address (transmission address) set in the Address 2 field (step S3).

Next, the information holding unit 106f of the wireless communication apparatus AP2 determines whether the confirmed transmission address is the MAC address of the wireless communication apparatus that has to hold the CFO value, that is, the MAC address of the wireless communication apparatus to be cooperated (step S4). The information holding unit 106f, for example, refers to a list of MAC addresses of the wireless communication apparatuses to be cooperated, which are notified in advance by the control apparatus 10, and determines whether the confirmed transmission address is the MAC address of the wireless communication apparatus that has to hold the CFO value. Alternatively, the information holding unit 106f refers to a list of MAC addresses of wireless communication apparatuses to be cooperated, which are generated in advance by collecting transmission addresses of beacon frames received by the wireless communication apparatus AP2, and determines whether the confirmed transmission address is the MAC address of the wireless communication apparatus that has to hold the CFO value.

In the process of step S4 described above, when it is determined that the confirmed transmission address is not the MAC address of the wireless communication apparatus that has to hold the CFO value (No in step S4), the information holding unit 106f discards the CFO value transmitted together with the MAC frame from the demodulation unit 105 (step S5) and ends the series of processes.

On the other hand, in the process of step S4 described above, when it is determined that the confirmed transmission address is the MAC address of the wireless communication apparatus that has to hold the CFO value (Yes in step S4), the information holding unit 106f determines whether there is the CFO value that is already held in association with the MAC address (step S6).

In the process of step 36 described above, when it is determined that there is no CFO value that is already held (No in step S6), the information holding unit 106f holes the CFO value transmitted from the demodulation unit 105 together with the MAC frame, the transmission address confirmed in the above process (MAC address of the wireless communication apparatus to be cooperated), and the current time indicated by the period measurement unit 106e in association with each other (Step S7) and ends the series of processes.

On the other hand, in the process of step S6 described above, when it is determined that there is the CFO value that is already held (Yes in step S6), the information holding unit 106f determines whether it is necessary to update the CFO value (step S8). The information holding unit 106f compares the time (holding time) associated with the already held CFO value with the current time, and determines that it is necessary to update the already held CFO value when a certain period or more (for example, 1 sec or more) has elapsed from the holding time.

In the process of step S8 described above, when it is determined that it is not necessary to update the CFO value (No in step S8), the information holding unit 106f performs the process of step S5 described above and ends the series of processes.

On the other hand, in the process of step S8 described above, when it is determined that it is necessary to update the CFO value (Yes in step S8), the information holding unit 106f performs the process of step S7 described above and ends the series of processes.

Figure 8:
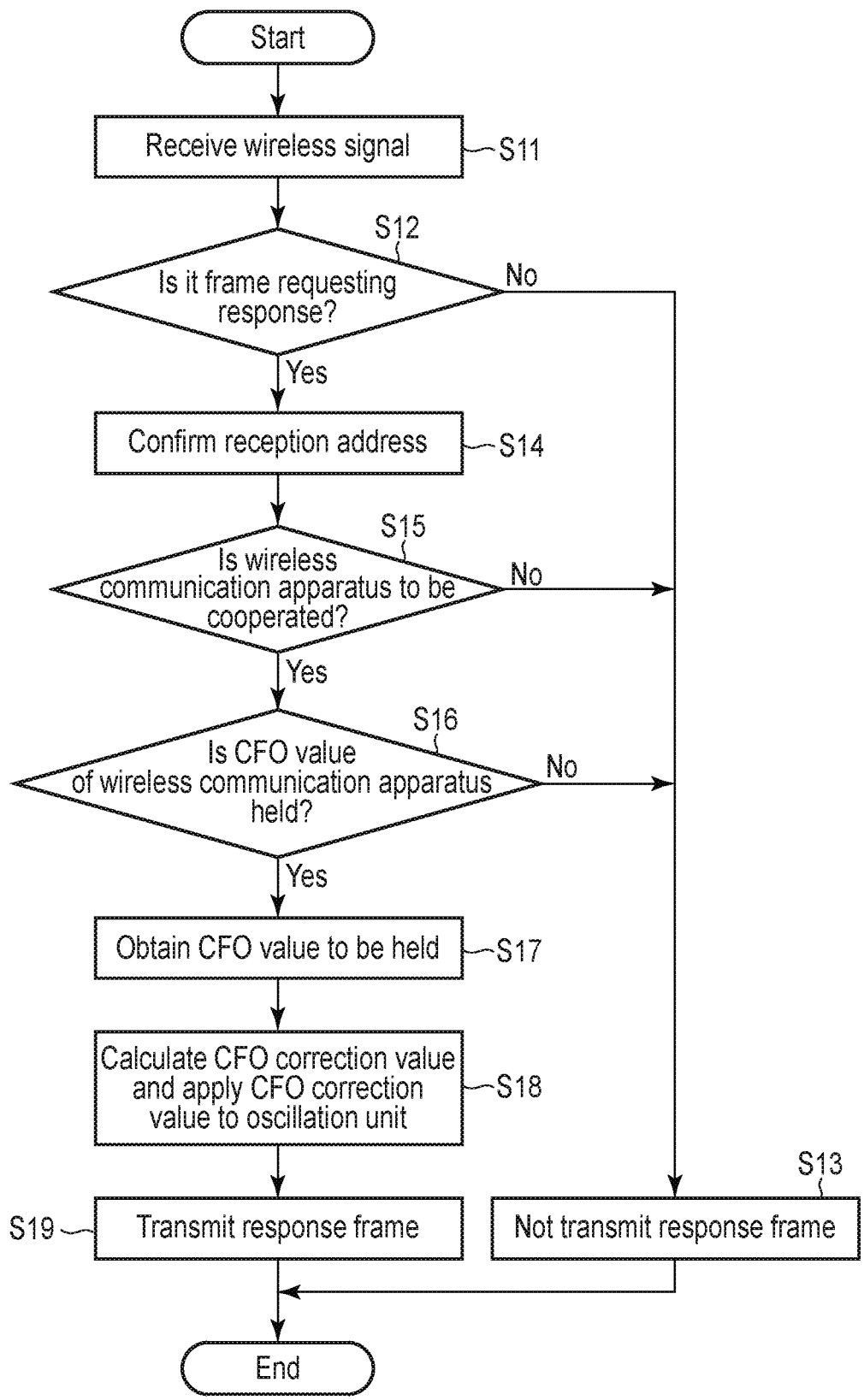
FIG. 8 is a flowchart illustrating another example of the operation of the wireless communication apparatus in the first embodiment.

FIG. 8 is a flowchart illustrating an example of a procedure of a process in which the wireless communication apparatus AP2 receives the data frame addressed to the wireless communication apparatus to be cooperated and returns the response frame at the same timing as the wireless communication apparatus to be cooperated.

First, the wireless communication apparatus AP2 receives the wireless signal (frame) (step S11). Subsequently, the frame analysis unit 106d of the wireless communication apparatus AP2 analyzes the MAC Header of the MAC frame transmitted from the demodulation unit 105 and determines whether the MAC frame is a frame that requests the response frame (step S12). The frame analysis unit 106d refers to the Type field and the Subtype field included in the Frame Control field and determines whether the MAC frame is a frame that requests the response frame. Alternatively, the frame analysis unit 106d refers to the QoS Control field and determines whether the MAC frame is a frame that requests the response frame.

In the process of step S12 described above, when it is determined that the transmitted MAC frame is a frame that does not request the response frame (No in step S12), the transmission determination unit 106b of the wireless communication apparatus AP2 ends the series of processes without transmitting the response frame to the MAC frame (step S13).

On the other hand, in the process of step S12 described above, when it is determined that the transmitted MAC frame is a frame that requests the response frame (Yes in step S12), the frame analysis unit 106d analyzes the MAC Header of the MAC frame, determines whether the CRC of the MAC frame is normal, and extracts the MAC address (reception address) set in the Address 1 field when the CRC of the MAC frame is normal (when the reception is successful) (step S14).

Next, the ID management unit 106c of the wireless communication apparatus AP2 determines whether the reception address extracted by the frame analysis unit 106d matches the MAC address of the wireless communication apparatus to be cooperated (step S15).

In the process of step S15 described above, when it is determined that the extracted reception address does not match the MAC address of the wireless communication apparatus to be cooperated (No in step 315), the transmission determination unit 106b performs the process of step S13 described above and ends the series of processes.

On the other hand, in the process of step S15 described above, when it is determined that the extracted reception address matches the MAC address of the wireless communication apparatus to be cooperated (Yes in step S15), the information holding unit 106f of the wireless communication apparatus AP2 determines whether there is the CFO value held in association with the MAC address (step S16).

In the process of step S16 described above, when it is determined that the CFO value is not held (No in step S16), the transmission determination unit 106b determines that the response frame may not be normally received at the destination even when the response frame is transmitted without reducing the carrier frequency offset, performs the process of step S13 described above, and ends the series of processes.

On the other hand, in the process of step S16 described above, when it is determined that the CFO value is held (Yes in step S16), the transmission determination unit 106b determines to return the response frame with respect to the MAC frame transmitted from the demodulation unit 105.

As described above, the transmission determination unit 106b determines to return the response frame when conditions (1) to (3) are satisfied: (1) the transmitted MAC frame is a frame that requests the response frame, (2) the destination MAC address of the MAC frame matches the MAC address of the wireless communication apparatus to be cooperated, and (3) the CFO value corresponding to the destination MAC address of the MAC frame is held.

When the transmission determination unit 106fc determines to return the response frame, the information holding unit 106f obtains the corresponding CFO value and notifies the PHY parameter setting unit 106a of the obtained CFO value. Further, the frame analysis unit 106d analyzes the MAC Header of the MAC frame transmitted from the demodulation unit 105, extracts the MAC address set in the Address 2 field as the destination MAC address for returning the response frame, and applies the extracted MAC address to the Address 1 field as the destination address of the return frame.

When SIFS has elapsed from the determination to return the response frame, the transmission determination unit 106b notifies the modulation unit 107 of the value of each field constituting the response frame. Further, when SIFS has passed from the determination to return the response frame, the PHY parameter setting unit 106a notifies the modulation unit 107 of the information indicating the transmission rate of the response frame, the information indicating the byte length, the CFO value, and the like (step S17).

The CFO correction unit 107a of the wireless communication apparatus AP2 calculates the CFO correction value for correcting the oscillation frequency generated when the wireless communication apparatus AP2 transmits the wireless signal, based on the CFO value transmitted from the MAC layer unit 106, and applies the calculated CFO correction value to the oscillation unit 103c (step S13). Therefore, the oscillation unit 103c can be controlled so that the carrier frequency offset, between the wireless communication apparatus AP2 and the wireless communication apparatus to be cooperated becomes zero or falls within the allowable error range.

The transmission unit 103b of the wireless communication apparatus AP2 returns the response frame by using the oscillation frequency generated by the oscillation unit 103c to which the CFO correction value is applied (step S19) and ends the series of processes.

According to the first embodiment described above, the wireless communication apparatus AP2 is added to the wireless LAN system configured by the existing wireless communication apparatus AP1 and the wireless communication apparatus STA, so as to cooperate with the existing wireless communication apparatus AP1. Here, CFO with the existing wireless communication apparatus AP1 is estimated in advance. Thus, when carrying out the cooperative transmission with the existing wireless communication apparatus AP1, the oscillation unit 103c can be controlled so that the carrier frequency offset with the existing wireless communication apparatus AP1 is reduced by the CFO correction value based on the estimated CFO. Therefore, it is possible to increase the probability that the wireless signal cooperatively transmitted by the existing wireless communication apparatus AP1 and the newly installed wireless communication apparatus AP2 will be normally received at the destination.

Further, as described above, since the wireless communication apparatus AP2 can realize the cooperative transmission with the existing wireless communication apparatus AP1, it is possible to improve the reliability of communication in the wireless LAM system configured by the existing wireless communication apparatus AP1 and the wireless communication apparatus STA.

Hereinafter, various modifications of the first embodiment will be described.

(First Modification)

The first modification differs from the above-described first embodiment, in that a wireless communication apparatus AP2 cooperates with a plurality of existing wireless communication apparatuses AP1-1 to AP1-3 (here, three wireless communication apparatuses) instead of one existing wireless communication apparatus AP1. In this case, an information holding unit 106f of the wireless communication apparatus AP2 holds a CFO value corresponding to each of the wireless communication apparatuses AP1-1 to AP1-3 to be cooperated.

FIG. 9 is a diagram illustrating an example of a holding format of CFO values of the wireless communication apparatuses AP1-1 to AP1-3 to be cooperated. As illustrated in FIG. 9, the information holding unit 106f of the wireless communication apparatus AP2 holds an identification number assigned to the wireless communication apparatus to be cooperated, a MAC address of the wireless communication apparatus to be cooperated, a CFO value, and a corresponding holding time of the CFO value in association with each other. For example, in the wireless communication apparatus AP1-1 to be cooperated, as illustrated in FIG. 9, an identification number "AP1-1", a MAC address "AA:BB:CC:00: 00:01", a CFO value "100", and a holding time "X" are held in association with each other. Similarly, in the wireless communication apparatus AP1-2 to be cooperated, as illustrated in FIG. 9, an identification number "AP1-2", a MAC address "AA:BB:CC:00:00:02", a CFO value "50", and a holding time "Y" are held in association with each other. Further, in the wireless communication apparatus AP1-3 to be cooperated, as illustrated in FIG. 9, an identification number "AP1-3", a MAC address "AA:BB:CC:00:00:03", a CFO value "−100", and a holding time "2" are held in association with each other. Note that when the CFO value is associated with the MAC address, it is possible to uniquely identify which wireless communication apparatus to be cooperated the CFO value corresponds to, and thus, the above-described identification number may be omitted as appropriate.

Figure 10:
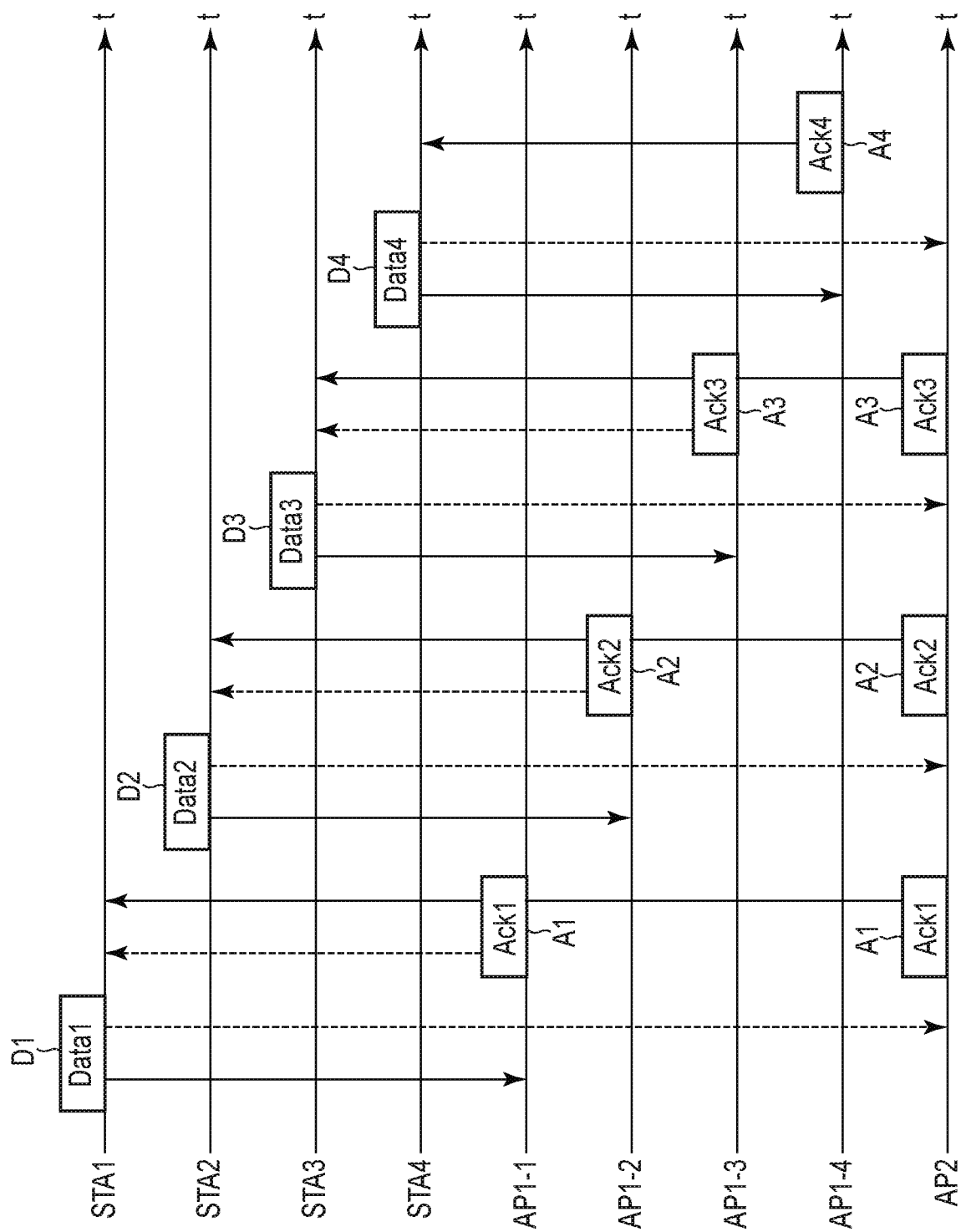
FIG. 10 is a diagram illustrating an overview of an operation of a wireless communication system in the first modification.

Here, the overview of the operation of the wireless communication system in the first modification will be described with reference to FIG. 10. In FIG. 10, it is assumed that wireless communication apparatuses STA1 to STA4 are wirelessly connected to wireless communication apparatuses AP1-1 to AP1-4, respectively. In other words, in FIG. 10, it is assumed that a plurality of wireless LAN systems are configured by the existing wireless communication apparatuses AP1-1 to AP1-4 and the wireless communication apparatuses STA1 to STA4. Further, in FIG. 10, for the purpose of cooperating with the existing wireless communication apparatuses AP1-1 to AP1-3, it is assumed that, the wireless communication apparatus AP2 already holds CFO values corresponding thereto. Note that, in FIG. 10, it is assumed that a response frame is an Ack frame.

As illustrated in FIG. 10, first, the wireless communication apparatus STA1 transmits a data frame D1 addressed to the wireless communication apparatus AP1-1, and the wireless communication apparatus AP1-1 receives the data frame D1. The wireless communication apparatus AP1-1 refers to the Address 1 field of the received data frame D1, confirms whether data included in the data frame D1 can be received without error when it is recognized that the destination of the data frame D1 is the own apparatus, and returns the Ack frame A1 addressed to the wireless communication apparatus STA1 when the reception is successful. Note that the Ack frame A1 is returned after SIFS has elapsed from the end of the received data frame D1.

On the other hand, when the wireless communication apparatus AP2 receives the data frame D1 as in the wireless communication apparatus AP1-1 to be cooperated, the wireless communication apparatus AP2 confirms whether the CFO value associated with the MAC address set in the Address 1 field of the data frame D1 is held.

Here, since a case in which the wireless communication apparatus AP2 holds CFO values corresponding to the wireless communication apparatuses AP1-1 to AP1-3 is assumed, the wireless communication apparatus AP2 confirms that the CFO value associated with the MAC address set in the Address 1 field of the data frame D1 is held, and the wireless communication apparatus AP2 determines to return the Ack frame A1 with respect to the data frame D1. Note that the Ack frame A1 is returned after SIFS has elapsed from the end of the received data frame D1, as in the wireless communication apparatus AP1-1. Therefore, the wireless communication apparatus AP2 can return the Ack frame A1 addressed to the wireless communication apparatus STA1 in cooperation with the existing wireless communication apparatus AP1-1.

Similarly, when data frames D2 and D3 are transmitted to the wireless communication apparatuses AP1-2 and AP1-3 by the wireless communication apparatuses STA2 and STA3, respectively, it is possible to return Ack frames A2 and A3 addressed to the wireless communication apparatuses STA2 and STA3 in cooperation with the wireless communication apparatuses AP1-2 and AP1-3 because the wireless communication apparatus AP2 holds the CFO values associated with the MAC addresses of the wireless communication apparatuses AP1-2 and AP1-3.

On the other hand, when a data frame D4 is transmitted to the v/ireless communication apparatus AP1-4 by the wireless communication apparatus STA4, the wireless communication apparatus AP2 determines that cooperative transmission with the wireless communication apparatus AP1-4 cannot be performed because the wireless communication apparatus AP2 does not hold the CFO value associated with the MAC address of the wireless communication apparatus AP1-4, and the Ack frame addressed to the wireless communication apparatus STA4 is not returned. Therefore, as illustrated in FIG. 10, only the Ack frame A4 from the wireless communication apparatus AP1-4 is returned to the wireless communication apparatus STA4.

According to the first modification described above, the wireless communication apparatus AP2 can also realize cooperative transmission with the plurality of wireless communication apparatuses AP1.

(Second Modification)

The second modification differs in that a Request to Send (RTS) frame transmitted to a wireless communication apparatus AP1 to be cooperated is received and a Clear to Send (CTS) frame is returned in response thereto, as illustrated in FIG. 11, instead of the process in which the wireless communication apparatus AP2 receives the data frame transmitted to the wireless communication apparatus AP1 to be cooperated and returns the response frame in response to the data frame. Both the RTS frame and the CTS frame are frames for reserving a communication period for transmitting a next data frame. Even in this case, it is possible to obtain the same effects as those of the first embodiment described above.

(Third Modification)

The third modification differs from the first embodiment, in that the wireless communication apparatus AP2 does not perform cooperative transmission when the CFO value corresponding to the wireless communication apparatus AP1 to be cooperated is held, but performs cooperative transmission when the CFO value corresponding to the wireless communication apparatus AP1 to be cooperated and the elapsed period from the start of holding the CFO value is less than a certain period (for example, 1 sec). In this case, the wireless communication apparatus AP2 may discard the CFO value corresponding to the wireless communication apparatus AP1 when the elapsed period from the start of holding the CFO value corresponding to the wireless communication apparatus AP1 to be cooperated becomes a certain period or more.

Figure 12:
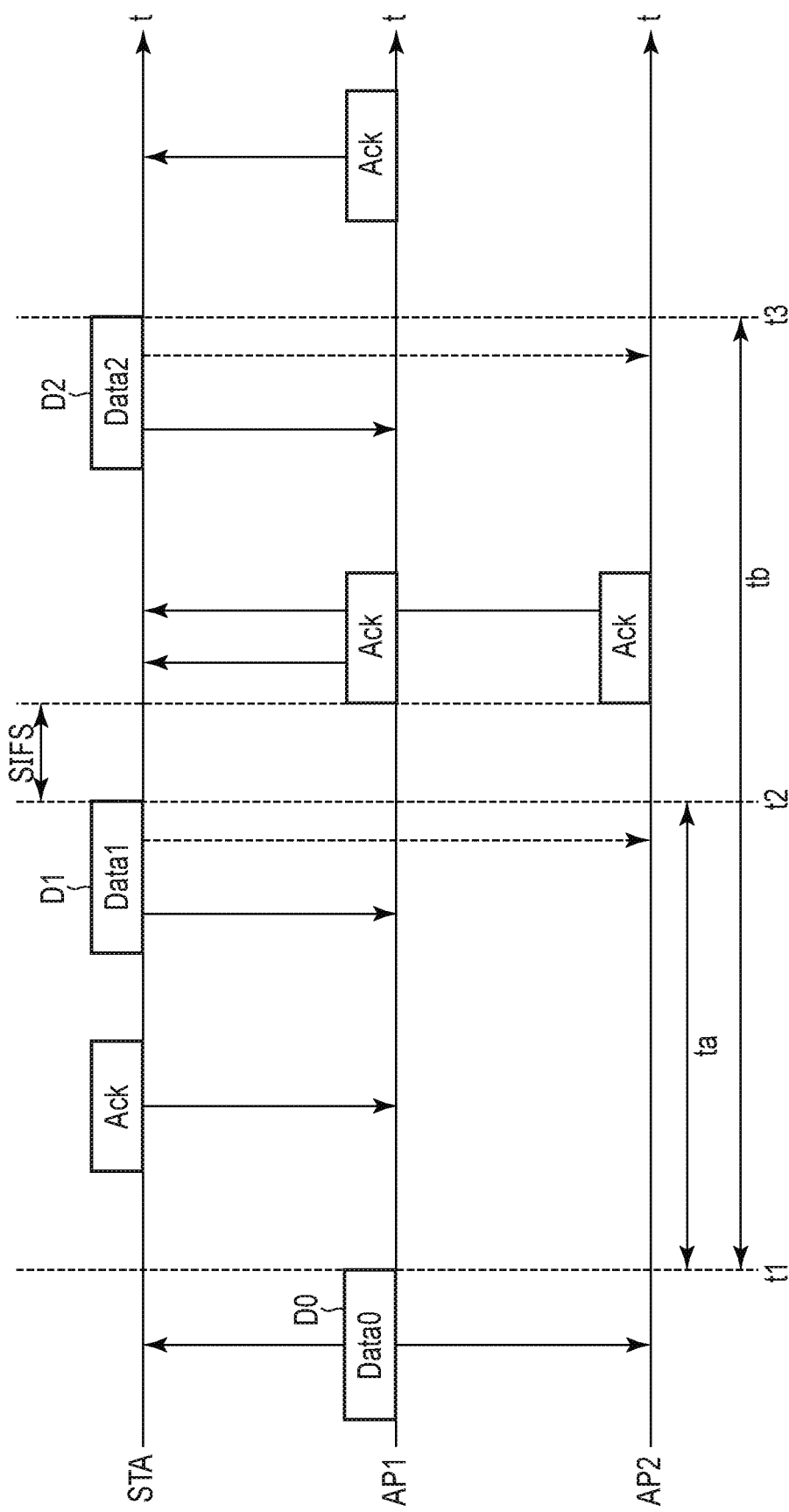
FIG. 12 is a diagram illustrating an overview of an operation of a wireless communication system in a third modification.

Here, the overview of the operation of the wireless communication system in the third modification will be described with reference to FIG. 12. Note that it is assumed that the elapsed period ta illustrated in FIG. 12 is less than the above-described certain period and the elapsed period tb illustrated in FIG. 12 is greater than or equal to the above-described certain period. In FIG. 12, the start point of the elapsed period is the end of the data frame D0, but the present embodiment is not limited thereto. The start point of the elapsed period may be the timing when the reception of the data frame D0 is started. Further, in FIG. 12, it is assumed that the elapsed period is from the above-described start point to the end of the data frames D1 and D2, but the present embodiment is not limited thereto. The elapsed period may be from the above-described start point to the timing when the reception of the data frames D1 and D2 is started. Alternatively, the elapsed period may be from the above-described start point to immediately before returning the Ack frame with respect to the data frames D1 and D2. In FIG. 12, it is assumed that a response frame is an Ack frame.

As illustrated in FIG. 12, when the wireless communication apparatus AP2 receives the data frame D0 transmitted by the wireless communication apparatus AP1 to be cooperated, the CFO with the wireless communication apparatus AP1 is estimated and the CFO value based on the estimated CFO starts to be held from time t1.

After that, when the data frame D1 addressed to the wireless communication apparatus AP1 to be cooperated is received at time t2, the wireless communication apparatus AP2 determines whether the CFO value corresponding to the wireless communication apparatus AP1 is held, and determines whether the elapsed period ta (=t2−t1) from the start of holding the CFO value corresponding to the wireless communication apparatus AP1 is less than the above-described certain period. In FIG. 12, since it is assumed that the period ta is less than the certain period, the wireless communication apparatus AP2 returns an Ack frame to the received data frame D1.

On the other hand, as illustrated in FIG. 12, when the data frame D2 addressed to the wireless communication apparatus AP1 to be cooperated is received at time t3, the wireless communication apparatus AP2 determines whether the CFO value corresponding to the v/ireless communication apparatus AP1 is held, and determines whether the elapsed period tb (=t3−t1) from the start of holding the CFO value corresponding to the v/ireless communication apparatus AP1 is less than the above-described certain period. In FIG. 12, since it is assumed that the period tb is greater than or equal to the certain period, the wireless communication apparatus AP2 does not return an Ack frame to the received data frame D2.

Note that even when the wireless communication apparatus AP2 discards the CFO value corresponding to the wireless communication apparatus AP1 every certain period, the CFO value corresponding to the wireless communication apparatus AP1 has already been discarded when the above-described data frame D2 is received, and the wireless communication apparatus AP2 does not hold the CFO value corresponding to the wireless communication apparatus AP1, and thus, the Ack frame is not returned to the data frame D2.

According to the third modification described above, when the elapsed period from holding the CFO value corresponding to the wireless communication apparatus AP1 to be cooperated is greater than or equal to the certain period, the v/ireless communication apparatus AP2 cannot perform cooperative transmission using the CFO value, considering the possibility that, the CFO value with the v/ireless communication apparatus AP1 will change, thereby further improving the reliability of communication.

Second Embodiment

Next, a second embodiment will be described. The wireless communication system according to the present embodiment is the same as the first embodiment described above, in that a plurality of wireless communication apparatuses AP cooperate with each other to transmit wireless signals to a wireless communication apparatus STA that is a destination, but differs from the first embodiment described above, in that cooperation of a plurality of wireless communication apparatuses AP is recognized in advance, one of the plurality of wireless communication apparatuses AP functions as a master, and the other one functions as a slave.

In the present embodiment, in transmitting a certain wireless signal to a wireless communication apparatus STA, the wireless communication apparatus AP functioning as a master transmits a trigger frame to another wireless communication apparatus AP functioning as a slave, and transmits the certain wireless signal the wireless communication apparatus STA in cooperation with another wireless communication apparatus AP functioning as a slave.

Further, in the present embodiment, the wireless communication apparatus AP functioning as a slave receives a trigger frame from the wireless communication apparatus AP functioning as a master, and when the own apparatus is included in the destination of the trigger frame, transmits the above-described certain wireless signal to the wireless communication apparatus STA according to an instruction from the wireless communication apparatus AP functioning as a master.

Here, an example of the format of the trigger frame used in the present, embodiment will be described with reference to FIG. 13. As illustrated in FIG. 13, the trigger frame includes a Frame Control field, a Duration field, an Address 1 field, an Address 2 field, a Common Info field, a User Info field, an FCS, and the like. Note that the same number of User Info fields as the number of wireless communication apparatuses AP functioning as a slave is set. FIG. 13 illustrates the format of the trigger frame when there are n wireless communication apparatuses AP functioning as a slave.

The Frame Control field, the Duration field, the Address 1 field, and the Address 2 field play the same role as in the case of the MAC frame illustrated in FIG. 2.

For example, a bit pattern capable of identifying the trigger frame is set in a Type field and a Subtype field (not illustrated) included in the Frame Control field. Specifically, a 2-bit bit pattern "01" is set in the Type field, and a 4-bit bit pattern "0010" is set in the Subtype field.

In the Address 1 field, the MAC address of the wireless communication apparatus AP that the wireless communication apparatus AP functioning as a master requests cooperative transmission (that is, the MAC address of the wireless communication apparatus AP functioning as a slave) is set. Note that, when there are a plurality of wireless communication apparatuses AP functioning as slaves, that is, when the trigger frame includes a plurality of User Info fields, a group address (for example, a broadcast address, a multicast address, etc.) may be set in the Address 1 field.

In the Address 2 field, the MAC address of the wireless communication apparatus AP functioning as a master is set.

The Common Info field is, for example, a field added when there are a plurality of wireless communication apparatuses AP functioning as a slave, and information that is commonly notified to the wireless communication apparatuses AP functioning as a slave is set.

As illustrated in FIG. 13, the Common Info field includes a Trigger Type field, a UL Length field, a Common PHY parameter field, and the like.

Information indicating the type of the trigger frame is set in the Trigger Type field. For example, when cooperative transmission is requested to the wireless communication apparatuses AP functioning as a slave, information indicating a Coordinate type is set as the type of the trigger frame. On the other hand, when Uplink Multi-User (UL MU) transmission is requested to the wireless communication apparatuses AP functioning as a slave, information indicating a Basic type is set as the type of the trigger frame.

In the UL Length field, information indicating a transmission time of a frame cooperatively transmitted by the wireless communication apparatuses AP functioning as a slave, or information that can calculate the transmission time (for example, the number of bytes) is set. Therefore, the end of the frame cooperatively transmitted by the wireless communication apparatus AP functioning as a master and the end of the frame transmitted by the wireless communication apparatuses functioning as a slave can be aligned. That is, the wireless communication apparatus AP functioning as a master and the wireless communication apparatuses AP functioning as a slave can simultaneously transmit; a certain frame.

A parameter commonly used in the PHY layer is set in the Common PHY parameter field when a plurality of wireless communication apparatuses AP functioning as a slave cooperatively transmit a certain frame. Specifically, information indicating the frequency bandwidth (for example, information indicating that the frequency bandwidth is 20 MHz, 40 MHz, 80 MHz width, etc.), information indicating the length of the Guard Interval of the PHY payload, and the like are set.

Information to be individually notified to the wireless communication apparatuses AP functioning as a slave is set in the User Info field.

As illustrated in FIG. 13, the User Info field includes an AID field, a RU position field, a User PHY parameter field, and the like.

An ID (AID) that is locally generated by the wireless communication apparatus AP functioning as a master in a network and is assigned to the wireless communication apparatus AP functioning as a slave is set in the AID field. This information is shared in advance between the wireless communication apparatus AP functioning as a master and the wireless communication apparatus AP functioning as a slave. The wireless communication apparatus AP functioning as a slave can refer to the AID field and determine whether the User Info field is the User Info field addressed to the own apparatus.

Information indicating the position of the RU (Resource Unit) permitted to be used by the wireless communication apparatus AP identified by the corresponding AID in cooperative transmission of a certain frame is set in the RU position field. The information indicating the position of the RU is an identification number assigned in advance to the RU uniquely determined by the frequency position and the frequency bandwidth, and this information is shared in advance between the wireless communication apparatus AP functioning as a master and the wireless communication apparatus AP functioning as a slave. Therefore, when the wireless communication apparatus AP functioning as a master sets a certain identification number in the RU position field, the wireless communication apparatus AP functioning as a slave can refer to the identification number and recognize at which frequency position and in what frequency bandwidth the frame is to be transmitted.

A parameter used in the PHY layer when the wireless communication apparatus AP identified by the corresponding AID cooperatively transmits a certain frame is set in the User PHY parameter field. Specifically, PHY transmission rate information indicating a Modulation and Code Scheme (MCS) Index and the number of streams (Nsts: number of space time streams) of the wireless communication apparatus AP identified by the corresponding AID, or information indicating the type (LDPC: Low Density Parity Check) of the error correction code applied to the wireless communication apparatus AP identified by the corresponding AID, or the like is set.

Here, the overview of the operation of the wireless communication system in the second embodiment will be described with reference to FIG. 14. At times t11 to t14 illustrated in FIG. 14, the operation when the wireless communication apparatus AP2 functions as a slave is illustrated, and at times t15 to t18, the operation when the wireless communication apparatus AP2 functions as a master is illustrated.

Hereinafter, first, the operation when the wireless communication apparatus AP2 functions as a slave will be described.

First, at time t11, the wireless communication apparatus AP1 functioning as a master transmits a trigger frame T1 addressed to the wireless communication apparatus AP2 that requests cooperative transmission, and the wireless communication apparatus AP2 receives the trigger frame T1.

The wireless communication apparatus AP2 recognizes that the own apparatus is included in the destination of the received trigger frame T1. For example, that the own apparatus is included in the destination of the trigger frame T1 may be recognized by referring to the Address 1 field of the trigger frame T1 and confirming that the MAC address of the own apparatus is set, may be recognized by referring to the Address 1 field of the trigger frame T1 and confirming that the broadcast address is set, or may be recognized by referring to the User Info field and confirming that the AID of the own apparatus is set.

Further, the wireless communication apparatus AP2 refers to the Common Info field of the received trigger frame T1 (for example, refers to the Trigger Type field) and recognizes that cooperative transmission is requested by the wireless communication apparatus AP1 that has transmitted the trigger frame T1 or that the function as a slave is requested. Further, the wireless communication apparatus AP2 recognizes that the transmission of the data frame D1 is requested by the received trigger frame T1. Further, the wireless communication apparatus AP2 refers to the Common Info field of the received trigger frame T1 and recognizes the information indicating the TID of the data frame D1 for which cooperative transmission is requested, the information indicating the sequence number, the information about the destination, and the like.

The wireless communication device AP2 estimates the CFO between the oscillation unit mounted on the wireless communication apparatus AP1 requested to perform cooperative transmission and the oscillation unit 103c mounted on the own device using the received trigger frame T1, and calculates the CFO value based on the estimated CFO, to be held.

At time t3 after SIFS has elapsed from the end (time t12) of the received trigger frame T1, the wireless communication apparatus AP2 calculates the CFO correction value based on the held CFO value, applies the calculated CFO correction value to the oscillation unit 103c, and transmits the data frame D1 for which cooperative transmission is requested to the wireless communication apparatus STA1. Therefore, it is possible to increase the probability that the data frame D1 will be normally received in the wireless communication apparatus STA1 that is the destination of the data frame D1.

The wireless communication apparatus AP2 functions as a slave of the wireless communication apparatus AP1 until time t14 when the Ack frame for the data frame D1 is returned from the wireless communication apparatus STA.

Next, the operation when the wireless communication apparatus AP2 functions as a master will be described.

First, at time t15, the wireless communication apparatus AP2 transmits, to the wireless communication apparatus AP3, a trigger frame T2 for requesting cooperative transmission of the data frame D2 addressed to the wireless communication apparatus STA2. When the trigger frame T2 is transmitted, the wireless communication apparatus AP2 transmits the trigger frame T2 to the wireless communication apparatus AP3 without performing the process of applying the CFO correction value to the oscillation unit 103c of the own apparatus. Note that, a variety of information similar to that of the trigger frame T1 described above is set in the trigger frame 12.

The wireless communication apparatus AP2 transmits the data frame D2 addressed to the wireless communication apparatus STA2 at time t17 after SIFS has elapsed from the end (time t16) of the transmitted trigger frame T2. At this time, the wireless communication apparatus AP2 transmits the data frame D2 by using the control method similar to that of the trigger frame T2. That, is, when the process of applying the CFO correction value to the oscillation unit 103c of the own apparatus is not performed at the time of transmitting the trigger frame T2, the wireless communication apparatus AP2 also transmits the data frame D2 without performing the process of applying the CFO correction value to the oscillation unit 103c of the own apparatus.

Alternatively, when the wireless communication apparatus AP2 transmits the trigger frame T2, the trigger frame T2 may be transmitted to the wireless communication apparatus AP3 by performing a process of approaching a specific CFO correction value or a specific carrier frequency. In this case, the wireless communication apparatus AP2 transmits the data frame D2 by performing a process of applying the CFO correction value used at the time of transmitting the trigger frame T2 to the oscillation unit 103c of the own apparatus or a process of approaching a specific carrier frequency during the transmission of the data frame D2.

On the other hand, the wireless communication apparatus AP3 for which cooperative transmission is requested by the wireless communication apparatus AP2 operates in the same manner as when the wireless communication apparatus AP2 functions as a slave. That is, the wireless communication apparatus AP3 calculates the CFO value corresponding to the wireless communication apparatus AP2 when receiving the trigger frame T2, calculates the CFO correction value based on the CFO value corresponding to the wireless communication apparatus AP2 at the time of cooperative transmission of the data frame D2 instructed to be transmitted by the trigger frame T2, and applies the calculated CFO correction value to the oscillation unit of the own apparatus. Therefore, since the control for reducing the carrier frequency offset is not performed in the wireless communication apparatus AP2 functioning as a master and the control for reducing the carrier frequency offset is performed in the wireless communication apparatus AP3 functioning as a slave, it is possible to increase the probability that the data frame D2 will be normally received by the wireless communication apparatus STA2 that is the destination of the data frame D2.

Note that the wireless communication apparatus AP2 functions as the master of the wireless communication apparatus APS until time t18 when the Ack frame for the data frame D2 is returned from the wireless communication apparatus STA2.

According to the second embodiment described above, the wireless communication apparatus AP2 can function as a master or a slave. When the wireless communication apparatus AP2 functions as a slave, the wireless communication apparatus AP2 can use the received trigger frame to estimate the CFO with the wireless communication apparatus AP that is the transmission source of the trigger frame, and can perform control so as to reduce the carrier frequency offset with respect to the wireless communication apparatus AP of the transmission source. Further, the wireless communication apparatus AP2 functions as a master, the wireless communication apparatus AP2 can instruct the destination wireless communication apparatus AP to perform control so as to reduce the carrier frequency offset with the own apparatus by the transmitted trigger frame. Therefore, it is possible to increase the probability that the frame instructed to be transmitted by the trigger frame or the frame instructing the transmission by the trigger frame will be normally received at the destination.

In each embodiment described above, the case in which the wireless communication apparatus AP2 controls the oscillation unit 103c so as to reduce the carrier frequency offset with another wireless communication apparatus AP that performs cooperative transmission, or controls another wireless communication apparatus AP requesting cooperative transmission to reduce the carrier frequency offset with the own apparatus has been described. However, for example, when it is possible to determine in advance what kind of control is to be performed between the wireless communication apparatus AP2 and another wireless communication apparatus AP at the time of cooperative transmission to the same destination, both the wireless communication apparatus AP2 and the other wireless communication apparatus AP may perform control so as to reduce the carrier frequency offset with respect to the destination, and when it is not possible to determine in advance what kind of control is to be performed between the wireless communication apparatus AP2 and another wireless communication apparatus AP, the control described in each embodiment may be performed.

According to at least one embodiment described above, the wireless communication apparatus AP2 can realize cooperative transmission with another wireless communication apparatus AP, and thus can realize highly reliable wireless communication.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless communication apparatus comprising:
    receiver circuitry configured to:
        receive a first frame addressed to another apparatus, the first frame being transmitted by a first wireless communication apparatus, and
        estimate a difference between an oscillation frequency of an oscillator of the first wireless communication apparatus and an oscillation frequency of an oscillator of the wireless communication apparatus based on the first frame; and
    transmitter circuitry configured to transmit a third frame at a frequency determined based on the difference during a period at least partially overlapping a period during which the first wireless communication apparatus transmits a second frame addressed to a second wireless communication apparatus.

2. The wireless communication apparatus of claim 1, wherein the transmitter circuitry is configured to determine whether to transmit the third frame based on estimating the difference by the receiver circuitry.

3. The wireless communication apparatus of claim 1, wherein when a sixth frame requesting transmission of the second frame is transmitted by the second wireless communication apparatus and the sixth frame is received by the receiver circuitry, the transmitter circuitry is configured to transmit the third frame based on that a destination of the sixth frame is the first wireless communication apparatus.

4. The wireless communication apparatus of claim 3, further comprising:
    a memory configured to:
        store identification information for identifying the first wireless communication apparatus and the difference corresponding to the first wireless communication apparatus in association with each other, and
        store identification information for identifying another first wireless apparatus and a difference between an oscillation frequency of an oscillator of the other first wireless communication apparatus and the oscillation frequency of the oscillator of the wireless communication apparatus in association with each other,
    wherein the transmitter circuitry is configured to transmit the third frame based on estimating the difference stored in association with the identification information indicated as the destination of the sixth frame.

5. The wireless communication apparatus of claim 3, wherein the transmitter circuitry is configured to transmit the third frame after a certain period has elapsed from the end of the sixth frame.

6. The wireless communication apparatus of claim 1, wherein the transmitter circuitry is configured to transmit the third frame at a frequency corrected to reduce the difference with the first wireless communication apparatus.

7. The wireless communication apparatus of claim 1, wherein the third frame is transmitted at a frequency that at least partially overlaps a frequency at which the second frame is transmitted.

8. The wireless communication apparatus of claim 1,
    wherein the receiver circuitry is configured to hold a first timing indicating a timing at which the difference is estimated, and
    wherein the transmitter circuitry is configured to transmit the third frame when a period elapsed from the first timing is less than a first period.

9. The wireless communication apparatus of claim 8, wherein the receiver circuitry is configured to discard the difference when the elapsed period from the first timing is more than the first period.

10. The wireless communication apparatus of claim 1, wherein a destination of the third frame is the second wireless communication apparatus.

11. The wireless communication apparatus of claim 1, wherein when the second frame is transmitted by using a frequency corrected by the first wireless communication apparatus so that a difference in oscillation frequency with the second wireless communication apparatus is reduced, the transmitter circuitry is configured to transmit the third frame by using the frequency corrected so that the difference in oscillation frequency with the second wireless communication apparatus is reduced.

12. A wireless communication apparatus comprising:
receiver circuitry configured to:
  receive a first frame transmitted by a first wireless communication apparatus, and
  estimate a difference between an oscillation frequency of an oscillator of the first wireless communication apparatus and an oscillation frequency of an oscillator of the wireless communication apparatus based on the first frame; and
transmitter circuitry configured to:
  transmit a third frame during a period at least partially overlapping a period during which the first wireless communication apparatus transmits a second frame addressed to a second wireless communication apparatus, and
  determine whether to transmit the third frame based on estimating the difference by the receiver circuitry.

13. The wireless communication apparatus of claim 12, wherein the first frame is a frame addressed to another apparatus.

14. A wireless communication apparatus comprising:
receiver circuitry configured to:
  receive a first frame transmitted by a first wireless communication apparatus, and
  estimate a difference between an oscillation frequency of an oscillator of the first wireless communication apparatus and an oscillation frequency of an oscillator of the wireless communication apparatus based on the first frame; and
transmitter circuitry configured to transmit a third frame at a frequency determined based on estimating the difference by the receiver circuitry during a period at least partially overlapping a period during which the first wireless communication apparatus transmits a second frame addressed to a second wireless communication apparatus,
wherein the transmitter circuitry is configured to transmit a fourth frame corresponding to the first frame to a third wireless communication apparatus, and in this case, transmit a fifth frame to a fourth wireless communication apparatus by a control method same as a control method for the fourth frame.

* * * * *